US012560954B2

(12) United States Patent
Yun et al.

(10) Patent No.: US 12,560,954 B2
(45) Date of Patent: Feb. 24, 2026

(54) TEMPERATURE CONTROL SYSTEM AND TEMPERATURE CONTROL METHOD FOR SEMICONDUCTOR MANUFACTURING DEVICE

(71) Applicant: SAMSUNG ELECTRONICS CO., LTD., Suwon-si (KR)

(72) Inventors: Hyeonjun Yun, Suwon-si (KR); Sangsu Yeh, Suwon-si (KR); Minsu Lee, Suwon-si (KR); Jonghwa Kim, Suwon-si (KR); Jooyeop Nam, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 135 days.

(21) Appl. No.: 18/468,613

(22) Filed: Sep. 15, 2023

(65) Prior Publication Data

US 2024/0192712 A1     Jun. 13, 2024

(30) Foreign Application Priority Data

Dec. 7, 2022     (KR) ........................ 10-2022-0169559

(51) Int. Cl.
    *G05D 23/19*      (2006.01)
    *H01L 21/683*     (2006.01)
(52) U.S. Cl.
    CPC ..... *G05D 23/1931* (2013.01); *H01L 21/6833* (2013.01)
(58) Field of Classification Search
    CPC ........... G05D 23/1393; G05D 23/1931; G05D 23/132; G05D 23/134; H01L 21/6833;
    (Continued)

(56) References Cited

U.S. PATENT DOCUMENTS 10,415,862 B2      9/2019  Seki et al.
10,692,748 B2      6/2020  Kim et al.
                 (Continued)

FOREIGN PATENT DOCUMENTS

KR        10-1367086        2/2014
KR        10-1739369        5/2017
                (Continued)

*Primary Examiner* — Marc E Norman
(74) *Attorney, Agent, or Firm* — Morgan, Lewis & Bockius LLP

(57) ABSTRACT

A temperature control system of a semiconductor manufacturing device includes first and second heating media storages that respectively store low-temperature heating media and high-temperature heating media, a mixing device including a mixing valve that mixes the low-temperature heating media and the high-temperature heating media at a predetermined mixing ratio, and a control device. The mixing device provides mixed heating media to a load, and distributes recovered heating media recovered from the load to the first and second heating media storages. The control device is configured to, by performing feed-forward control and feedback control over a mixing unit temperature using a relationship model between a reference temperature representing a temperature of heating media passing through the load and the mixing unit temperature which is a temperature of heating media output by the mixing valve, control the mixing ratio such that the reference temperature has a target reference temperature.

20 Claims, 16 Drawing Sheets

(58) Field of Classification Search
CPC ......... H01L 21/67017; H01L 21/67109; H01L
21/67248; H01L 21/67098
See application file for complete search history.

(56)                     References Cited

U.S. PATENT DOCUMENTS

| | | | |
|---|---|---|---|
| 10,854,425 | B2 | 12/2020 | Mahadeswaraswamy et al. |
| 2009/0005912 | A1* | 1/2009 | Srivastava ......... G05D 23/1919 |
| | | | 236/91 C |
| 2015/0107268 | A1 | 4/2015 | Han et al. |
| 2015/0176928 | A1* | 6/2015 | Tabuchi ............. G05D 23/1951 |
| | | | 165/96 |
| 2019/0393059 | A1 | 12/2019 | Zhang et al. |
| 2021/0247786 | A1 | 8/2021 | Kobayashi |
| 2023/0147288 | A1* | 5/2023 | Mimura ............ H01L 21/67248 |
| | | | 700/42 |

FOREIGN PATENT DOCUMENTS

| | | |
|---|---|---|
| KR | 10-1862003 | 5/2018 |
| KR | 10-2018-0064129 | 6/2018 |
| KR | 10-2107594 | 5/2020 |
| KR | 10-2020-0075612 | 6/2020 |
| KR | 10-2290890 | 8/2021 |
| KR | 10-2372462 | 3/2022 |
| KR | 10-2403661 | 5/2022 |

* cited by examiner

PIPE LINE
SIGNAL LINE

TEMPERATURE CONTROL SYSTEM AND TEMPERATURE CONTROL METHOD FOR SEMICONDUCTOR MANUFACTURING DEVICE

CROSS-REFERENCE TO RELATED APPLICATION(S)

This application claims priority under 35 U.S.C. § 119 to Korean Patent Application No. 10-2022-0169559, filed on Dec. 7, 2022 in the Korean Intellectual Property Office, the disclosure of which is incorporated by reference herein in its entirety.

TECHNICAL FIELD

Example embodiments of the present disclosure relate to a temperature control system and a temperature control method for a semiconductor manufacturing device.

DISCUSSION OF RELATED ART

As advancements are made in semiconductor device technology, the importance of control precision of devices applied to semiconductor manufacturing facilities has increased. For example, vacuum chambers in which various deposition and etching processes for semiconductor substrate materials such as silicon wafers are performed may require precise temperature control depending on process recipes.
quickly

SUMMARY

An example embodiment of the present disclosure provides a temperature control system which may perform rapid feedback control even when there is a delay before heating media is transferred from a heating media mixing unit to an electrostatic chuck.

An example embodiment of the present disclosure provides a temperature control system which may control a feed-forward input such that a temperature of an electrostatic chuck quickly reaches a reference temperature.

An example embodiment of the present disclosure provides a temperature control system which may stably maintain a flow rate of heating media transferred to an electrostatic chuck and pressure in a flow path even when a degree of opening and closing a valve of a mixing unit fluctuates in real time due to feedback control.

According to an example embodiment of the present disclosure, a temperature control system of a semiconductor manufacturing device includes a first heating media storage configured to store low-temperature heating media, a second heating media storage configured to store high-temperature heating media that has a relatively higher temperature than the low-temperature heating media, and a mixing valve configured to mix the low-temperature heating media and the high-temperature heating media at a predetermined mixing ratio and to supply the mixed heating media to a load. The system further includes a first bypass valve configured to recover the low-temperature heating media output by the first heating media storage to the first heating media storage, a second bypass valve configured to recover the high-temperature heating media output by the second heating media storage to the second heating media storage, a distribution valve configured to distribute a recovered heating media recovered from the load to the first heating media storage and the second heating media storage, a synchronous controller configured to synchronously control the mixing valve, the first bypass valve, the second bypass valve, and the distribution valve based on the mixing ratio and a flow path through which heating media flows through the first heating media storage, the second heating media storage, the mixing valve, the first bypass valve, the second bypass valve, the load, and the distribution valve. The system further includes a mixing unit temperature sensor disposed at an output end of the mixing valve in the flow path, a reference temperature sensor disposed more adjacent to the load than the mixing unit temperature sensor in the flow path, and a control device configured to obtain a target reference temperature for a reference temperature measured by the reference temperature sensor from an external entity, to change the target reference temperature to a target mixing unit temperature of a mixing unit temperature based on a relationship model between the reference temperature and the mixing unit temperature measured by the mixing unit temperature sensor, and to control a position of the mixing valve based on the target mixing unit temperature and the mixing unit temperature.

According to an example embodiment of the present disclosure, a temperature control system of a semiconductor manufacturing device includes a first heating media storage configured to store low-temperature heating media, a second heating media storage configured to store high-temperature heating media having a relatively higher temperature than the low-temperature heating media, a mixing device including a mixing valve configured to mix the low-temperature heating media and the high-temperature heating media at a predetermined mixing ratio, and a control device. The mixing device is configured to provide mixed heating media to a load, and to distribute recovered heating media recovered from the load to the first heating media storage and the second heating media storage. The control device is configured to, by performing feed-forward control and feedback control over a mixing unit temperature using a relationship model between a reference temperature representing a temperature of heating media passing through the load and the mixing unit temperature which is a temperature of heating media output by the mixing valve, control the mixing ratio such that the reference temperature has a target reference temperature.

According to an example embodiment of the present disclosure, a temperature control system of a semiconductor manufacturing device, the temperature control system includes: a mixing valve supplying mixed heating media obtained by mixing low-temperature heating media and high-temperature heating media at a predetermined mixing ratio to a load, wherein a temperature of the high-temperature heating media is greater than a temperature of the low-temperature heating media; and a control device determining a target reference temperature of a reference temperature sensor configured to measure a temperature of a heating medium in a flow path adjacent to the load, converting the target reference temperature into a target mixing unit temperature for a mixing unit temperature sensor adjacent to a mixing valve configured to mix the low-temperature heating media and the high-temperature heating media, performing reference shaping on the target mixing unit temperature and adjusting the mixing ratio based on a result of the reference shaping and the mixing unit temperature, and adjusting the mixing ratio based on the reference temperature measured by the reference temperature sensor and the target reference temperature when the reference temperature reaches a temperature within a predetermined range from the target reference temperature.

According to an example embodiment of the present disclosure, a temperature control method of a semiconductor manufacturing device includes supplying mixed heating media obtained by mixing low-temperature heating media and high-temperature heating media at a predetermined mixing ratio to a load, determining a target reference temperature of a reference temperature sensor configured to measure a temperature of a heating medium in a flow path adjacent to the load, converting the target reference temperature into a target mixing unit temperature for a mixing unit temperature sensor adjacent to a mixing valve configured to mix the low-temperature heating media and the high-temperature heating media, performing reference shaping on the target mixing unit temperature and adjusting the mixing ratio based on a result of the reference shaping and the mixing unit temperature, and adjusting the mixing ratio based on the reference temperature measured by the reference temperature sensor and the target reference temperature when the reference temperature reaches a temperature within a predetermined range from the target reference temperature.

BRIEF DESCRIPTION OF THE DRAWINGS

The above and other features of the present disclosure will be more clearly understood from the following detailed description, taken in combination with the accompanying drawings, in which.

DETAILED DESCRIPTION

Figure 1A:
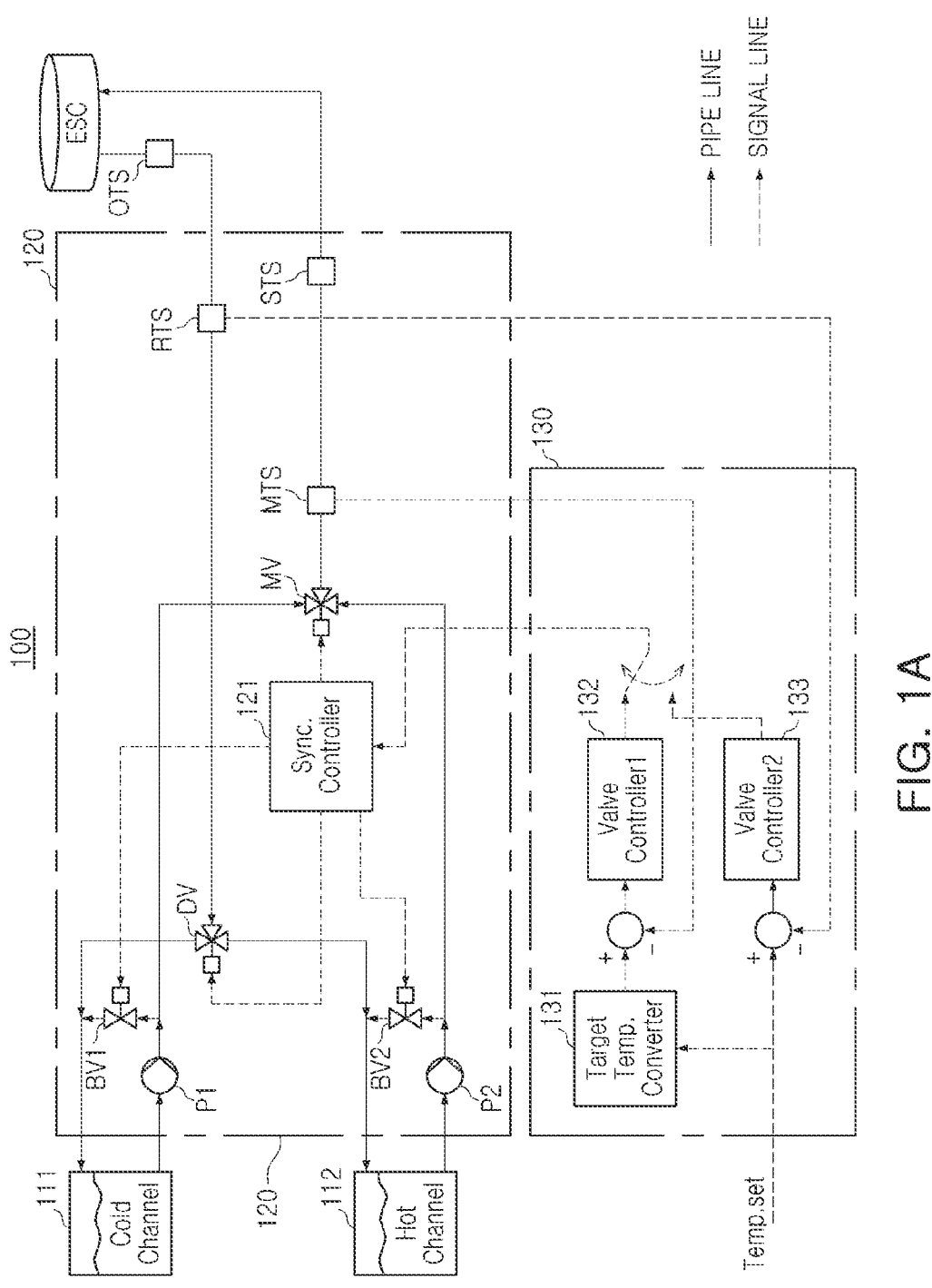
FIGS. 1A and 1B are diagrams illustrating a temperature control system according to an example embodiment of the present disclosure.

Embodiments of the present disclosure will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an embodiment may be described as a "second" element in another embodiment.

It should be understood that descriptions of features or aspects within each embodiment should typically be considered as available for other similar features or aspects in other embodiments, unless the context clearly indicates otherwise.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. Other words used to describe the relationships between components should be interpreted in a like fashion.

Figure 1B:
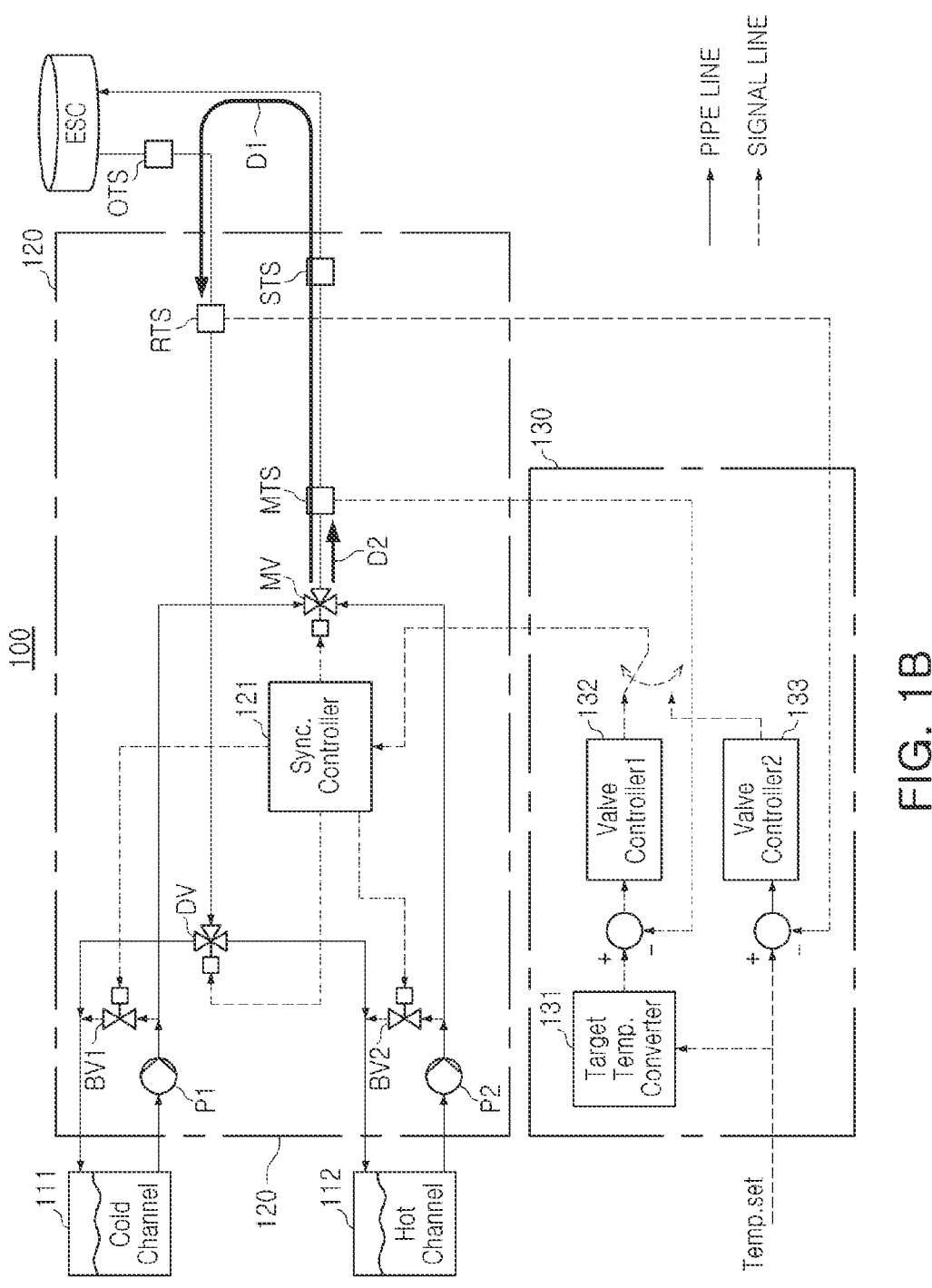

FIGS. 1A and 1B are diagrams illustrating a temperature control system according to an example embodiment.

Referring to FIG. 1A, the temperature control system 100 may include a first heating media storage 111, a second heating media storage 112, a mixing device 120, and a control device 130. The temperature control system 100 may mix low-temperature heating media stored in the first heating media storage 111 and high-temperature heating media stored in the second heating media storage 112 in the mixing device 120, and may provide the mixed heating media to a load (e.g., electrostatic chuck (ESC)). The low-temperature heating media and high-temperature heating media may include, for example, a fluid or a gas that conveys heat from one location to another. However, the low-temperature heating media and high-temperature heating media are not limited thereto. Also, the temperature control system 100 may circulate the heating media by distributing the recovered heating media recovered from the load ESC to the first heating media storage 111 and the second heating media storage 112. Here, the load ESC may be an electrostatic chuck (ESC) on which the wafer is fixed. The low-temperature heating media stored in the first heating media storage 111 may have a lower temperature relative to the high-temperature heating media stored in the second heating media storage 112.

The first heating media storage 111 may include a cooler that maintains the temperature of the stored heating media at a predetermined first temperature. The second heating media storage 112 may include a heater that maintains the temperature of the stored heating media at a second temperature higher than the first temperature. For example, the first temperature may be about 10° C. and the second temperature may be about 90° C., but example embodiments are not limited thereto. A device that supplies low-temperature heating media, such as the first heating media storage 111, may be referred to as a cold channel, and a device that supplies high-temperature heating media, such as the second heating media storage 112, may be referred to as a hot channel.

The mixing device 120 may mix the low-temperature heating media provided from the first heating media storage 111 and the high-temperature heating media provided from the second heating media storage 112 to have a predetermined temperature, and may provide mixed heating media to the electrostatic chuck ESC. Also, the mixing device 120 may distribute the recovered heating media recovered from the electrostatic chuck ESC to the first heating media storage 111 and the second heating media storage 112.

The control device 130 may receive a target temperature from an external entity and may control the mixing device 120 to supply heating media having a target temperature to an electrostatic chuck ESC. For example, a process recipe may call for the temperature of a wafer to be switched in the order of 60° C.-80° C.-40° C.-80° C.-60° C. within a unit section. One or more target temperatures defined in the process recipe may be referred to as a target temperature set, and the target temperature set may be received by the control device 130.

The mixing device 120 may provide a flow path through which the heating media may move. In FIG. 1A, a pipeline included in a flow path is indicated by a solid arrow. Also, the mixing device 120 may include a plurality of pumps P1 and P2 that supply the heating media of the first and second heating media storage 111 and 112 to the flow path, and a plurality of valves MV, DV, BV1, and BV2 for controlling the flow rate of the heating media flowing through the flow path MV, DV, BV1, and BV2.

The plurality of valves may include a mixing valve MV, a distribution valve DV and bypass valves BV1 and BV2. The mixing valve MV may mix the heating media supplied from the first and second heating media storages 111 and 112 at a predetermined ratio and may provide the mixed heating media to the electrostatic chuck ESC. The control device 130 may control the position of the mixing valve MV such that the heating media may be mixed at a predetermined mixing ratio.

The bypass valves BV1 and BV2 may control the amount of heating media supplied from the first and second heating media storages 111 and 112 to the mixing valve MV. For example, the position of the first bypass valve BV1 may be controlled such that, from the low temperature heating media output by the first heating media storage 111, only a predetermined amount of heating media may be supplied to the mixing valve MV and the excessive amount of heating media may be recovered to the first heating media storage 111. Similarly, the position of the second bypass valve BV2 may be controlled such that only a predetermined amount of heating media of the low temperature heating media output by the second heating media storage 112 may be supplied to the mixing valve MV and the excessive amount of heating media may be recovered to the second heating media storage 112. The amount of low-temperature heating media and high-temperature heating media supplied to the mixing valve MV may be determined by the amount in which the flow rate and pressure of the mixed heating media supplied from the mixing valve MV to the load ESC may be maintained to be constant.

The distribution valve DV may distribute the recovered heating media recovered from the electrostatic chuck ESC at a predetermined ratio, and may supply the distributed heating media to the first and second heating media storages 111 and 112, respectively. For example, the position of distribution valve DV may be controlled according to the ratio of the heating media provided from each of the first and second heating media storage 111 and 112 in the mixing valve MV, such that the amount of heating media of each of the first and second heating media storage 111 and 112 may be maintained to be constant.

According to an example embodiment, the mixing device 120 may further include a synchronous controller 121 which may control the positions of the distribution valve DV and bypass valves BV1 and BV2 in conjunction with the position of the mixing valve MV. The synchronous controller 121 may stably maintain the flow rate and pressure of the heating media supplied to the electrostatic chuck ESC by synchronously controlling the plurality of valves MV, DV, BV1, and BV2. The synchronous controller 121 will be described in greater detail below.

When the control device 130 quickly and accurately controls the temperature of the electrostatic chuck ESC, the throughput of the semiconductor manufacturing device may be increased and the quality of the produced wafer may be increased. However, since the control device 130 adjusts the mixing ratio of the heating media, it may be difficult to quickly and accurately control the temperature of the electrostatic chuck ESC spaced apart from the mixing valve MV.

According to an example embodiment, the control device 130 may use a relationship model between the reference temperature representing the temperature of the heating media passing through the electrostatic chuck ESC and the mixing unit temperature, which is the temperature of the heating media output by the mixing valve. The control device 130 may control the mixing ratio such that the reference temperature may have a target temperature by performing feed-forward control and feedback control over the mixing unit temperature using the relationship model.

Referring to FIG. 1A, a mixing unit temperature sensor MTS, a supply unit temperature sensor STS, an external temperature sensor OTS and a recovery unit temperature sensor RTS may be disposed in the flow path of the temperature control system 100. Temperature sensors MTS, STS, and RTS may be included in the mixing device 120, and an external temperature sensor OTS may be disposed outside the mixing device 120.

The mixing unit temperature sensor MTS may be disposed on the output end of the mixing valve MV in the flow path, and may measure the temperature of the heating media output by the mixing valve MV. The supply unit temperature sensor STS may measure the temperature of the heating media output by the mixing device 120 to an external entity, and the recovery unit temperature sensor RTS may measure the temperature of the heating media recovered from the external entity to the mixing device 120. Also, an external temperature sensor OTS may be disposed around the electrostatic chuck ESC in the flow path, and may measure the temperature of the heating media output by the electrostatic chuck ESC.

The length of the flow path between the mixing valve MV and the electrostatic chuck ESC may vary in example embodiments, and may reach several meters. Due to the length of the flow path, the temperature of the heating media may fluctuate while the heating media output by the mixing valve MV is supplied to the electrostatic chuck ESC through the flow path. Accordingly, when the position of the mixing valve MV is adjusted based on the target temperature, the temperature of the heating media supplied to the electrostatic chuck ESC may be different from the target temperature. That is, there may be difficulty in feed-forward control of the mixing valve MV position due to temperature fluctuations of the heating media.

Also, due to the length of the flow path, a delay may occur until the heating media output by the mixing valve MV is supplied to the electrostatic chuck ESC through the flow path. For example, the delay may be about 10 seconds. That is, it may take about 10 seconds for the result of adjusting the position of the mixing valve MV by the control device 130 to be reflected in the temperature around the electrostatic chuck ESC. Due to the delay, it may be difficult for the control device 130 to obtain the temperature around the electrostatic chuck ESC and to control the position of the mixing valve MV in feedback control.

According to an example embodiment, the control device 130 may perform the feed-forward control and feedback control using a model representing a relationship between the temperature of a reference temperature sensor and the temperature of a mixing unit temperature sensor MTS.

The reference temperature sensor may be a sensor which measures a reference temperature representing the temperature of an electrostatic chuck ESC. The reference temperature sensor may be configured to be more adjacent to the electrostatic chuck ESC than the mixing unit temperature sensor MTS on the flow path of the temperature control system 100. For example, the reference temperature sensor may be at least one of a supply unit temperature sensor STS, a recovery unit temperature sensor RTS, and an external temperature sensor OTS. In the example in FIG. 1A, a recovery unit temperature sensor RTS disposed in the mixing device 120 and able to measure the temperature of heating media via an electrostatic chuck ESC may function as a reference temperature sensor.

The control device 130 may perform temperature control such that the measured value of the reference temperature sensor may coincide with the target temperature using the model. For example, when the reference temperature sensor is configured as a recovery unit temperature sensor RTS, the control device 130 may use a model representing a relationship between the recovery unit temperature and the mixing unit temperature.

The control device 130 may determine how many degrees the mixing unit temperature should have in order for the recovery unit temperature to be the same as the target temperature using the above-mentioned model. The control device 130 may perform feed-forward control over the positions of the plurality of valves MV, DV, BV1, and BV2 based on the determined mixing unit temperature. Also, the control device 130 may compare the measured value of the mixing unit temperature sensor MTS with the determined mixing unit temperature and may perform feedback control over the positions of the plurality of valves MV, DV, BV1, and BV2.

The control device 130 may include a target temperature converter 131, a first valve controller 132 and a second valve controller 133. The target temperature converter 131 may convert the target temperature received from the external entity into the target temperature of the mixing unit temperature sensor MTS using the model. Hereinafter, a target temperature received from an external entity may be referred to as a target reference temperature, and a target temperature for a mixing unit temperature sensor MTS may be referred to as a target mixing unit temperature.

The first valve controller 132 may perform feed-forward control based on the target mixing unit temperature from the target temperature converter 131 and feedback control based on the measured value of the mixing unit temperature sensor MTS. Also, the second valve controller 133 may perform feed-forward control based on a target reference temperature received from an external entity and feedback control based on a measured value of a recovery unit temperature sensor RTS. The first valve controller 132 and the second valve controller 133 may be selectively enabled through a switch.

FIG. 1B illustrates a first length D1, which is the length of the flow path between the mixing valve MV and the recovery unit temperature sensor RTS in the temperature control system 100 in FIG. 1A, and a second length D2, the length of the flow path between the mixing valve MV and the mixing unit temperature sensor MTS.

According to an example embodiment, the control device 130 may determine the position of the mixing valve MV based on the target mixing unit temperature determined based on the relationship model between the mixing unit temperature and the recovery unit temperature. Accordingly, the control device 130 may perform feed-forward control to allow the recovery unit temperature to reach the target recovery unit temperature by controlling the position of the mixing valve MV based on the target mixing unit temperature.

According to an example embodiment, the control device 130 may immediately obtain the mixing unit temperature, which is the temperature of the heating media output by the mixing valve MV, using the mixing unit temperature sensor MTS, and may perform feedback control based on the obtained mixing unit temperature. That is, the control device 130 may quickly and accurately perform feedback control without delay.

Hereinafter, a temperature control system according to an example embodiment will be described in greater detail with reference to FIGS. 2 to 8.

Figure 2:
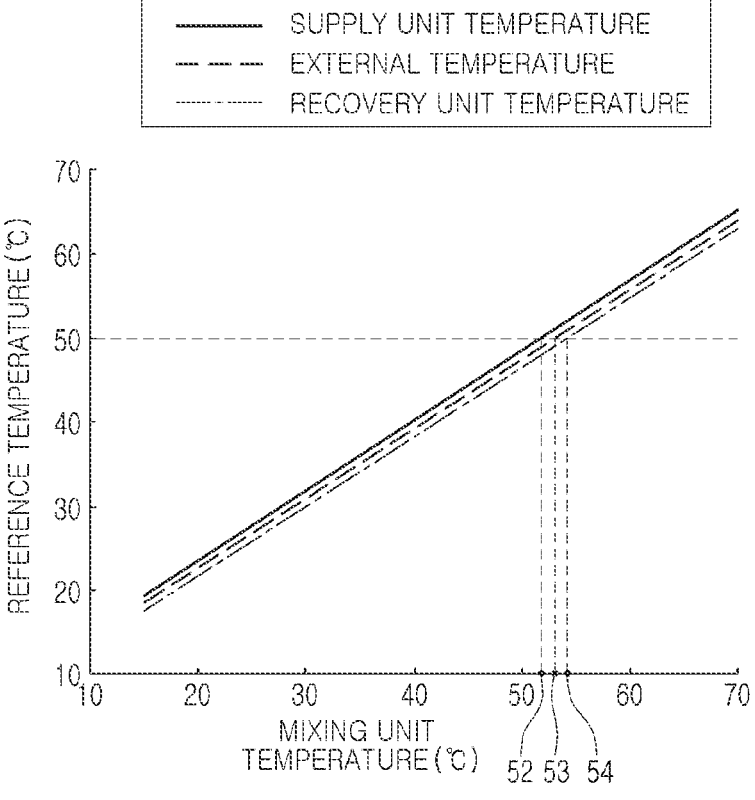
FIG. 2 is a diagram illustrating a relationship model between a mixing unit temperature and a reference temperature.

FIG. 2 is a diagram illustrating a relationship model between a mixing unit temperature and a reference temperature.

FIG. 2 illustrates the supply unit temperature according to mixing unit temperature, the external temperature and the recovery unit temperature. Each of the relationship between the mixing unit temperature and the supply unit temperature, the relationship between the mixing unit temperature and the external temperature, and the relationship between the mixing unit temperature and the recovery unit temperature may be modeled as a proportional relationship.

Referring to FIG. 1A, on the flow path, the mixing unit temperature sensor MTS may be most adjacent to the mixing valve MV, and the supply unit temperature sensor STS, the external temperature sensor OTS and the recovery unit temperature sensor RTS may be separated from the mixing valve MV in order. The heating media output by the mixing valve MV may be cooled gradually by passing through the mixing unit temperature sensor MTS, the supply unit temperature sensor STS, the external temperature sensor OTS and the recovery unit temperature sensor RTS. The graph in FIG. 2 illustrates that, when the mixing unit temperature is the same, the temperature decreases in the order of the supply unit temperature, the external temperature, and the recovery unit temperature.

According to an example embodiment, a target reference temperature for reference temperature may be converted into a target mixing unit temperature for mixing unit temperature based on a relationship model between the mixing unit temperature and the reference temperature. For example, when the supply unit temperature is predetermined as the reference temperature, the target mixing unit temperature when the target reference temperature is 50° C. may be determined as 52° C. When the external temperature is predetermined as the reference temperature, the target mixing unit temperature when the target reference temperature is 50° C. may be determined as 53° C. When the recovery unit temperature is predetermined as the reference temperature, the target mixing unit temperature when the target reference temperature is 50° C. may be determined as 54° C.

Figure 3:
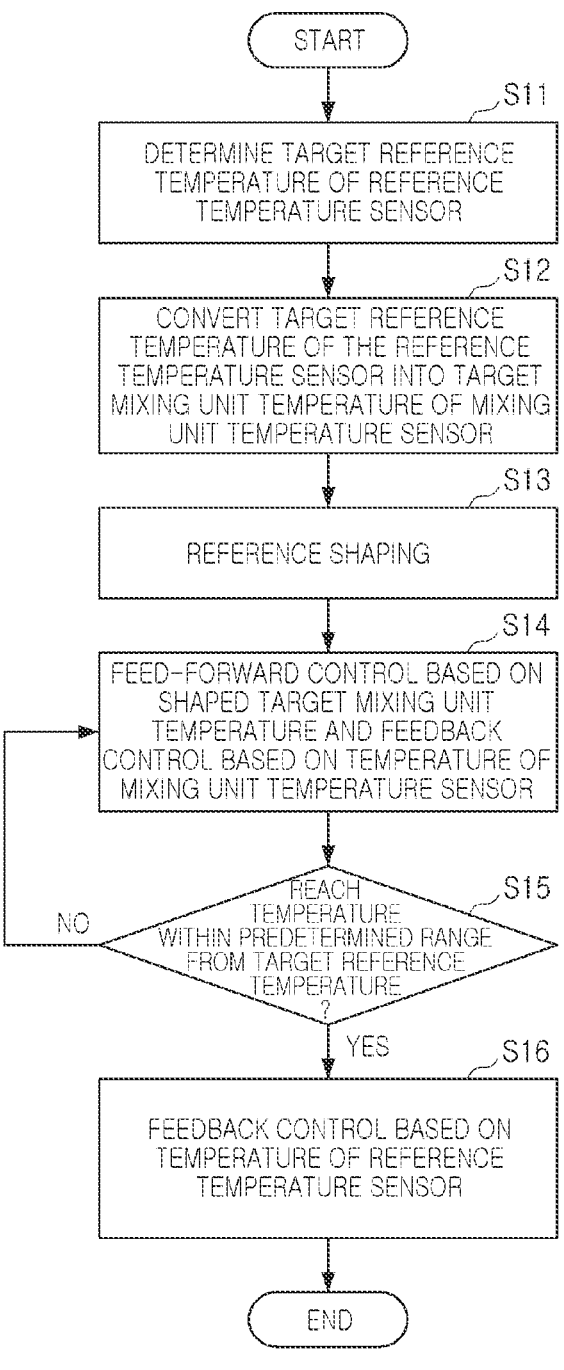
FIG. 3 is a flowchart illustrating a temperature control method according to an example embodiment of the present disclosure.

Hereinafter, a method of performing feed-forward control and feedback control according to the target mixing unit temperature determined based on the relationship model between the mixing unit temperature and the reference temperature will be described in detail. FIG. 3 is a flowchart illustrating a temperature control method according to an example embodiment.

Referring to FIGS. 1A and 3, in operation S11, the control device 130 may determine the target reference temperature of the reference temperature sensor. For example, the control device 130 may determine a target temperature included in a target temperature set received from an external entity as a target reference temperature. For example, the reference temperature sensor may be a recovery unit temperature sensor RTS, and the target reference temperature may be a target recovery unit temperature.

In operation S12, the target temperature converter 131 of the control device 130 may convert the target reference temperature of the reference temperature sensor into the target mixing unit temperature of the mixing unit temperature sensor. The target temperature converter 131 may convert the temperature based on the relationship model between the reference temperature and the mixing unit temperature described with reference to FIG. 2.

In operation S13, the first valve controller 132 may perform reference shaping for target mixing unit temperature. Reference shaping may refer to an operation of shaping the target mixing unit temperature such that the measured value of the reference temperature sensor may quickly reach the target reference temperature. An example of reference shaping according to an example embodiment will be described below with reference to FIG. 4.

In operation S14, the first valve controller 132 may perform feed-forward control based on the shaped target mixing unit temperature and feedback control based on the temperature of the mixing unit temperature sensor MTS. For example, the first valve controller 132 may control the positions of the plurality of valves MV, DV, BV1, and BV2 based on the shaped target mixing unit temperature. Also, the first valve controller 132 may adjust the plurality of valves MV, DV, BV1, and BV2 based on the measured value of the mixing unit temperature sensor MTS based on the control results of plurality of valves MV, DV, BV1, and BV2.

The position of a plurality of valves MV, DV, BV1, and BV2 may be synchronously controlled. A method for synchronous control of valves according to an example embodiment will be described below with reference to FIG. 5.

In operation S15, the first valve controller 132 may determine whether the measured value of the reference temperature sensor has reached a temperature within a predetermined range from the target reference temperature. For example, the first valve controller 132 may determine whether the measured value of the reference temperature sensor has a difference within +4° C. from the target reference temperature.

When the measured value of the reference temperature sensor does not reach a temperature within the predetermined range from the target reference temperature (in operation S15, "No"), the first valve controller 132 may repeatedly perform operation S14 and operation S15.

When the measured value of the reference temperature sensor reaches a temperature within a predetermined range from the target reference temperature (in operation S15, "Yes"), the second valve controller 133 may perform feedforward control based on the target reference temperature, and reference feedback control based on the temperature of the temperature sensor in operation S16. The control device 130 may quickly control the mixing unit temperature using the first valve controller 132, and may perform feed-forward control and feedback control over the recovery unit temperature using the second valve controller 133, thereby precisely controlling the recovery unit temperature. The control signal path of the first valve controller 132 and the control signal path of the second valve controller 133 will be described below with reference to FIGS. 6A and 6B.

Figure 4:
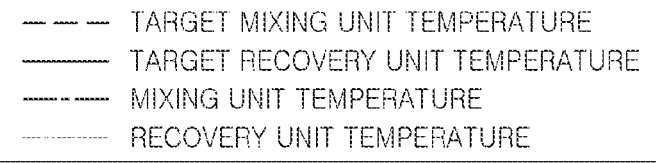
FIG. 4 is a diagram illustrating a mixing unit temperature and a recovery unit temperature with respect to a temperature control method described with reference to FIG. 3.
Figure 4:
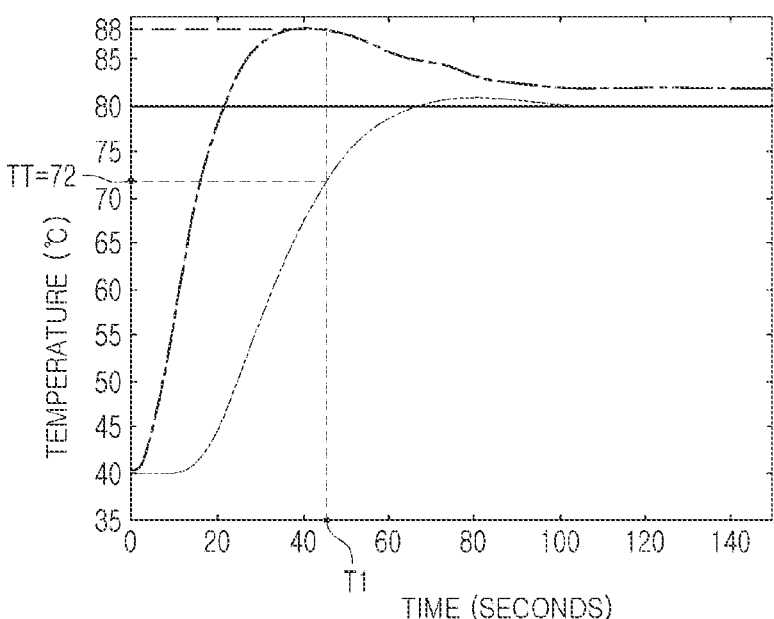

FIG. 4 is a diagram illustrating a mixing unit temperature and a recovery unit temperature with respect to a temperature control method described with reference to FIG. 3.

FIG. 4 illustrates a target mixing unit temperature, a target recovery unit temperature, and mixing unit temperature measurement values and recovery unit temperature measurement values over time. FIG. 4 illustrates an example in which the recovery unit temperature of 40° C. at 0 seconds is to be raised to the target recovery unit temperature of 80° C. For example, when the previous target recovery unit temperature is 40° C. and the recovery unit temperature is maintained at 40° C., and the new target recovery unit temperature is configured to be 80° C., the recovery unit temperature may be raised to 80° C.

According to an example embodiment, to quickly raise the recovery unit temperature to the target recovery unit temperature, the first valve controller 132 may determine the target mixing unit temperature using reference shaping until the recovery unit temperature reaches the critical temperature TT, and feed-forward control and feedback control may be performed based on the set target mixing unit temperature. Also, the first valve controller 132 may perform feedforward control and feedback control based on the target recovery unit temperature after the recovery unit temperature reaches the critical temperature TT.

The critical temperature TT may be determined as a temperature between the previous target recovery unit temperature and the new target recovery unit temperature. For example, the critical temperature TT may be determined such that a difference between the critical temperature TT and the previous target recovery unit temperature may be 80% of a difference between the new target recovery unit temperature and the previous target recovery unit temperature. Referring to FIG. 4, the difference between the previous target recovery unit temperature 40° C. and the new target recovery unit temperature 80° C. may be 40° C., and the critical temperature TT may be determined as 72° C., which has a difference of 32° C. with the previous target recovery unit temperature 40° C. However, the ratio between the difference between the critical temperature TT and the previous target recovery unit temperature and the difference between the new target recovery unit temperature and the previous target recovery unit temperature is not limited to 80%.

The shaped target mixing unit temperature may be determined based on a previous target recovery unit temperature, a new target recovery unit temperature, and a relationship model between the mixing unit temperature and the recovery unit temperature. When the previous target recovery unit temperature 40° C. is to be raised to the new target recovery unit temperature 80° C., by configuring the shaped target recovery unit temperature to be higher than the new target recovery unit temperature 80° C., the previous target recovery unit temperature may quickly reach the target recovery unit temperature. For example, the shaped target recovery unit temperature may be determined as 86° C. by increasing the reference target recovery unit temperature by 15% of the difference between the previous target recovery unit temperature of 40° C. and the new target recovery unit temperature of 80° C. Also, the shaped target recovery unit temperature may be determined as the shaped target mixing unit temperature based on a relationship model between the mixing unit temperature and the recovery unit temperature. For example, based on the shaped target recovery unit temperature of 86° C., the shaped target mixing unit temperature may be determined to be 88° C.

The result of converting the shaped target recovery unit temperature to the target mixing unit temperature may be higher than the maximum temperature of the mixed heating media. For example, when the temperature of the high-temperature heating media stored in the second heating media supply unit 112 is 90° C., the maximum temperature of the mixed heating media may be 90° C. When the conversion result is higher than 90° C., which is the maximum temperature of the mixed heating media, the shaped target mixing unit temperature may be determined as the maximum temperature of the mixed heating media.

Referring to FIG. 4, until the first time point T1 before the measured value of the recovery unit temperature reaches the critical temperature TT of 72° C., the target mixing unit temperature may be determined as the shaped target mixing unit temperature, for example, 88° C. Also, feed-forward control and feedback control may be performed on the mixing unit temperature based on the critical temperature TT. The recovery unit temperature may be controlled in conjunction with the mixing unit temperature.

After the first time point T1 when the measured value of the recovery unit temperature reaches the critical temperature TT, feed-forward control and feedback control may be performed on the position of the mixing valve MV based on the target recovery unit temperature and the recovery unit temperature. Since feed-forward control and feedback control are performed based on the temperature of the recovery unit temperature sensor RTS, the recovery unit temperature may be maintained to be constant.

Contrary to the example in FIG. 4, when the new target recovery unit temperature is lower than the previous target recovery unit temperature, the first valve controller 132 may perform reference shaping and may determine a temperature lower than the new target mixing unit temperature as the shaped target mixing unit temperature, and may perform feed-forward control and feedback control over the mixing unit temperature based on the shaped target mixing unit temperature until the recovery unit temperature reaches the critical temperature.

For example, when lowering the previous target recovery unit temperature of 80° C. to a new target recovery unit temperature of 40° C., the critical temperature may be determined such that a difference between the previous target recovery unit temperature and critical temperature may be 80% of the difference between the reference target recovery unit temperature and the new target recovery unit temperature. That is, the critical temperature may be determined as 48° C. having a difference of 32° C. from the previous target recovery unit temperature of 80° C.

The shaped target mixing unit temperature may be determined based on the previous target recovery unit temperature, the new target recovery unit temperature, and the relationship model between the mixing unit temperature and the recovery unit temperature. When the previous target recovery unit temperature 80° C. is lowered to the new target recovery unit temperature 40° C., by determining the shaped recovery unit temperature to be lower than 40° C., the previous target recovery unit temperature may quickly reach the new target recovery unit temperature. For example, by reducing the target recovery unit temperature by 15% of the difference between the previous target recovery unit temperature of 80° C. and the new target recovery unit temperature of 40° C., the shaped target recovery unit temperature may be determined as 34° C. Also, based on a relationship model between mixing unit temperature and recovery unit temperature, the shaped target recovery unit temperature may be determined as 36° C.

When the position of the mixing valve MV is controlled in real time by feedback control based on the target recovery unit temperature or the target mixing unit temperature, and the positions of the distribution valve DV and bypass valves BV1 and BV2 is not interlocked with the position of the mixing valve MV, an imbalance in flow rate and pressure may occur in each section of the flow path. The imbalance in flow rate and pressure may cause damage to pipes included in the flow path.

Figure 5:
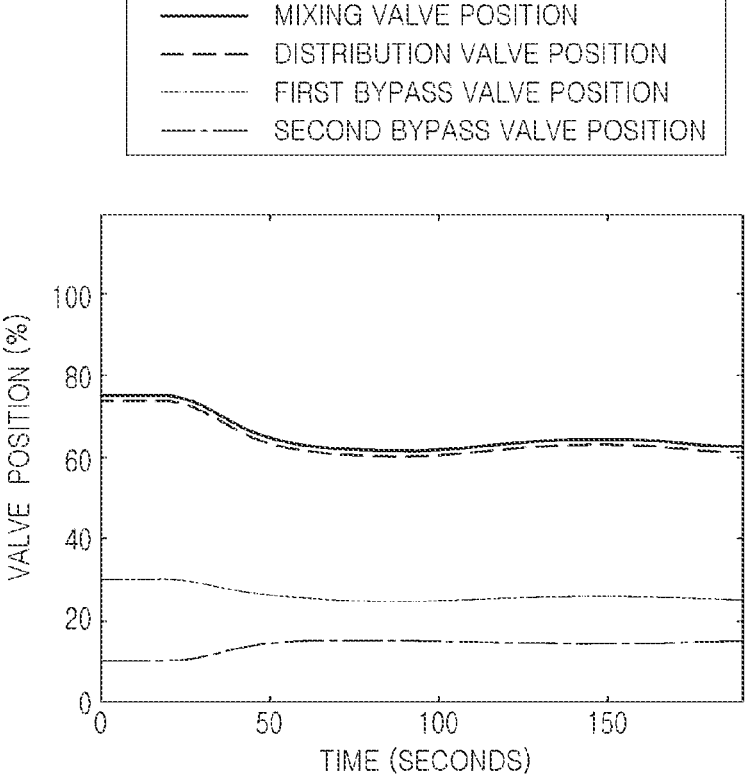
FIG. 5 is a diagram illustrating a method of synchronously controlling valves according to an example embodiment of the present disclosure.

FIG. 5 is a diagram illustrating a method of synchronously controlling valves according to an example embodiment.

FIG. 5 illustrates the position of the mixing valve MV, the position of the distribution valve DV, and the position of the first and second bypass valves BV1 and BV2 over time. According to an example embodiment, the positions of the distribution valve DV and bypass valves BV1 and BV2 may be controlled in conjunction with the position of the mixing valve MV according to the target temperature.

Referring to FIGS. 1A and 5 together, the mixing valve MV and distribution valve DV may be three-way proportional control valves, and the first and second bypass valves BV1 and BV2 may be two-way proportional control valves.

In the three-way proportional control valve, the position of the valve may be related to the flow direction of the heating media. For example, the position of the mixing valve MV may be determined between 0% and 100%. When the position of the mixing valve MV is 0%, the high-temperature heating media from the second heating media storage 112 may be blocked, and only the low-temperature heating media from the first heating media storage 111 is transferred to the electrostatic chuck ESC. Conversely, when the position of the mixing valve MV is 100%, the low-temperature heating media is blocked and only the high-temperature heating media us supplied to the electrostatic chuck ESC. When the position of the mixing valve MV is 50%, the low-temperature heating media and the high-temperature heating media may be mixed at a ratio of 1:1 and may be supplied to the electrostatic chuck ESC.

The position of the distribution valve DV may also be determined between 0% and 100%. When the position of the distribution valve DV is 0%, the entirety of the heating media recovered from the electrostatic chuck ESC may be supplied to the first heating media storage 111. Conversely, when the position of the distribution valve DV is 100%, the entirety of the recovered heating media may be supplied to the second heating media storage 112. When the position of the distribution valve DV is 50%, the recovered heating media may be supplied to the first heating media storage 111 and the second heating media storage 112 at a ratio of 1:1.

In the two-way proportional control valve, the position of the valve may be related to the degree of opening and closing of the valve. For example, when the position of the valve in the bypass valves BV1 and BV2 is 0%, the valve may be blocked, and the entirety of the heating media output by the first and second pumps P1 and P2 may be supplied to the mixing valve MV. When the position of the valve in the bypass valves BV1 and BV2 is 100%, the valve may be fully opened, and a large amount of heating media output by the first and second pumps P1 and P2 may be recovered to the first and second heating media storage 111 and 112.

According to an example embodiment, the synchronous controller 121 may synchronously control the plurality of valves MV, DV, BV1, and BV2 based on a control signal from the first valve controller 132 or the second valve controller 133. For example, the synchronous controller 121 may be implemented as an electronic cam.

According to an example embodiment, the position of the mixing valve MV and the position of the distribution valve DV may be controlled such that the ratio of the heating media of the first heating media storage 111 and the second heating media storage 112 output by the mixing valve MV and the ratio of heating media distributed to the first heating media storage 111 and the second heating media storage 112 through the distribution valve DV. For example, the position of the mixing valve MV may fluctuate over time, and the position of the distribution valve DV may fluctuate identically to the position of the mixing valve MV.

According to an example embodiment, the positions of the plurality of bypass valves BV1 and BV2 may be synchronously controlled based on the ratio of the low-temperature heating media and the high-temperature heating media output by the mixing valve MV. For example, the first bypass valve BV1 may be opened more as the ratio of the low-temperature heating media of the heating media output by the mixing valve MV is lower, such that a large amount of heating media may be recovered. Similarly, the second bypass valve BV2 may be opened more as the ratio of the high-temperature heating media of the heating media output by the mixing valve MV is lower, such that a larger amount of heating media may be recovered. That is, the position of the first bypass valve BV1 may be controlled to be inversely proportional to the mixing ratio of the low-temperature heating media and the high-temperature heating media, and the position of the second bypass valve BV2 may be controlled to be proportional to the mixing ratio.

In short, the position of the bypass valves BV1 and BV2 and the position of the distribution valve DV may be controlled based on a function of the position of the mixing valve MV.

Figure 6A:
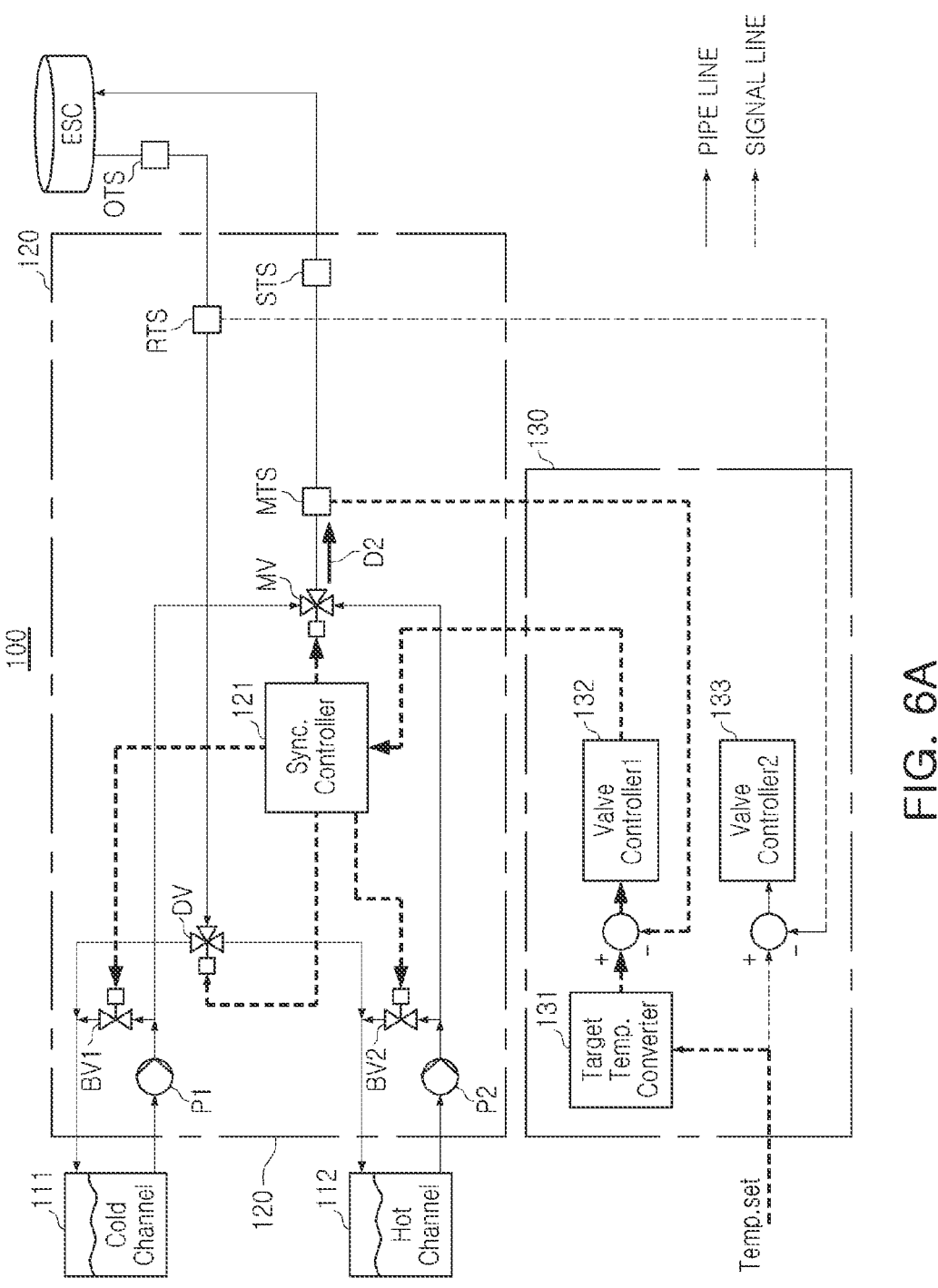
FIGS. 6A and 6B are diagrams illustrating operations of a temperature control system according to an example embodiment of the present disclosure.
Figure 6B:
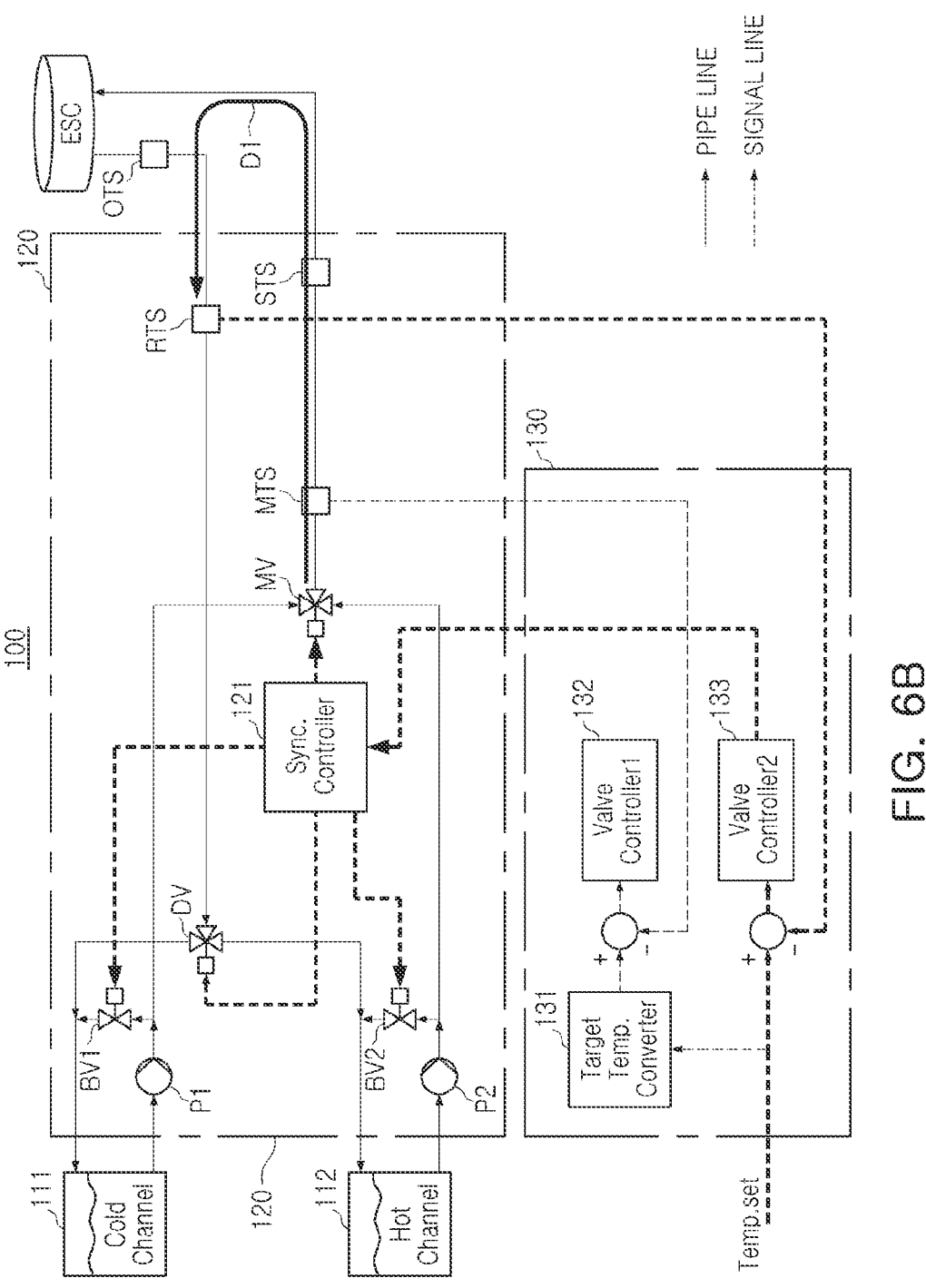

FIGS. 6A and 6B are diagrams illustrating operations of a temperature control system according to an example embodiment.

Referring to FIGS. 1A and 6A, the control device 130 may enable the synchronous controller 121 by controlling a switch. FIG. 6A illustrates a signal path when the first valve controller 132 is enabled. In FIG. 6A, the signal path is illustrated as a thick broken line.

Referring to FIG. 6A, the target temperature set may be transmitted to the target temperature converter 131. The target temperature converter 131 may convert the target recovery unit temperature for the recovery unit temperature into the target mixing unit temperature for the mixing unit temperature, and may transfer the converted target mixing unit temperature to the first valve controller 132.

The first valve controller 132 may perform reference shaping based on the target mixing unit temperature. The first valve controller 132 may provide the shaped target mixing unit temperature to the synchronous controller 121 according to the reference shaping result. The synchronous controller 121 may adjust the position of the mixing valve MV based on the shaped target mixing unit temperature, thereby adjusting the mixing ratio of the low-temperature heating media of the first heating media storage 111 and the high temperature of the second heating media storage 112. The synchronous controller 121 may synchronously control the positions of the remaining valves DV, BV1, and BV2 in conjunction with the position adjustment of the mixing valve MV.

The mixing unit temperature sensor MTS may measure the temperature of the heating media output by the mixing valve MV and may feedback the measured value to the first valve controller 132. The first valve controller 132 may adjust the position of the valves MV, DV, BV1, and BV2 or may enable the second valve controller 133 according to the feedback result.

For example, the first valve controller 132 may enable the second valve controller 133 when a measured value of the mixing unit temperature sensor MTS reaches a predetermined critical temperature.

FIG. 6B illustrates a signal path when the second valve controller 133 is enabled. Referring to FIG. 6B, the target temperature set received from the external entity may be input to the second valve controller 133. The second valve controller 133 may perform feed-forward control and feedback control over the mixing ratio based on the recovery unit temperature.

The second valve controller 133 may perform feed-forward control over the mixing ratio based on the target recovery unit temperature received from the external entity, and feedback control may be performed over the mixing ratio based on the temperature of the recovery unit temperature sensor RTS.

When the first valve controller 132 controls the mixing unit temperature to be a temperature close to the target mixing unit temperature, the recovery unit temperature may also be controlled to a temperature close to the target recovery unit temperature. Accordingly, when the second valve controller 133 performs temperature control of the recovery unit temperature sensor RTS, a measured value of the recovery unit temperature sensor RTS may be stably maintained without shaking. Accordingly, even when there is a delay between the mixing valve MV and the recovery unit temperature sensor RTS, precise feedback control may be performed.

Figure 7:
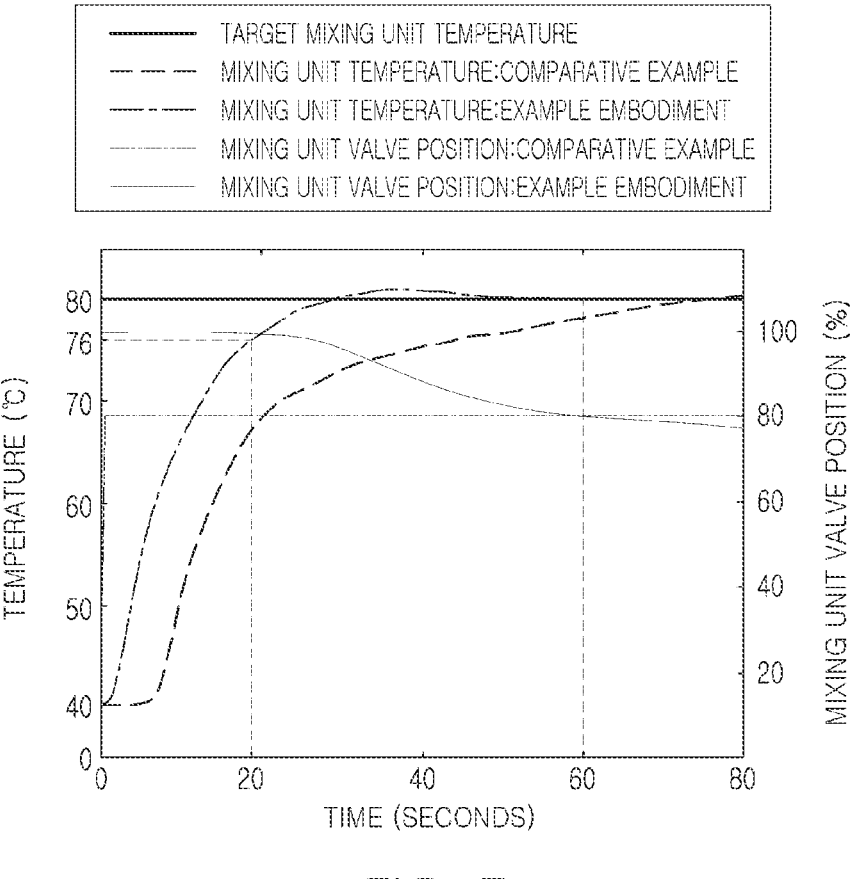
FIGS. 7 and 8 are diagrams illustrating temperature control performance of a mixing unit according to an example embodiment of the present disclosure and a comparative example.
Figure 8:
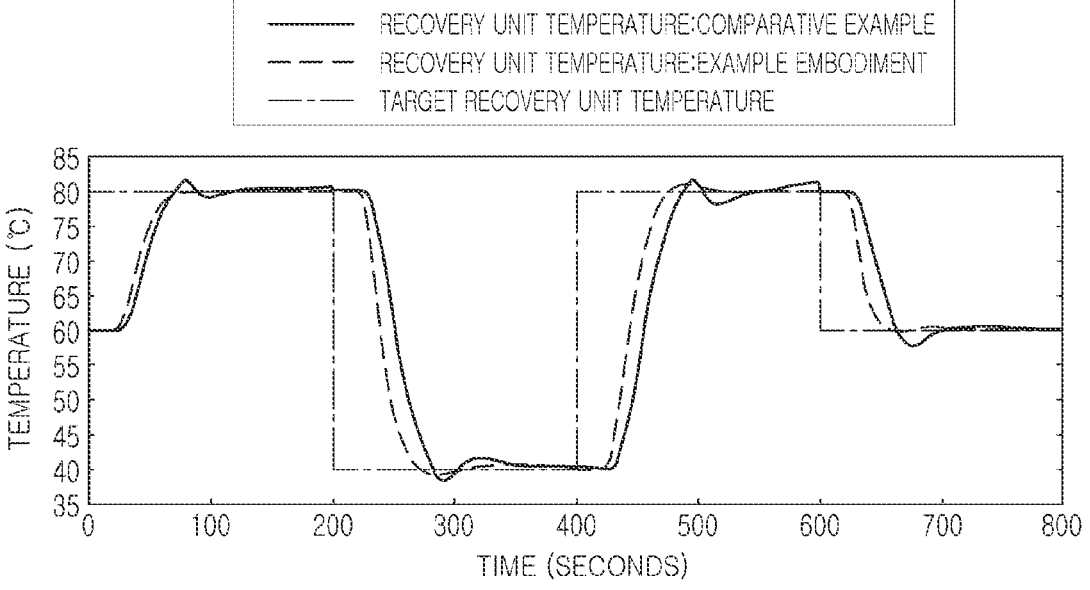

FIGS. 7 and 8 are diagrams illustrating temperature control performance of a mixing unit according to an example embodiment.

FIG. 7 is a diagram illustrating comparison of a mixing unit valve position and a mixing unit temperature between a comparative example and an example embodiment. In the comparative example and example embodiment, an operation of raising the previous mixing unit temperature of 40° C. to the target mixing unit temperature of 80° C. may start from 0 seconds.

According to a comparative example different from the example embodiment, the position of the mixing valve may be fixed according to the target mixing unit temperature. In the example in FIG. 7, the position of the mixing valve may be maintained at about 80%. That is, the mixing valve may continuously output mixed heating media having a temperature of 80° C., which is the target mixing unit temperature. At the output end of the mixing valve, as the heating media having a temperature of 40° C. is mixed with the heating media having a temperature of 40° C., it may take a relatively long time for the measured value of the mixing unit temperature sensor MTS to reach the temperature of 80° C. In the example in FIG. 7, according to the comparative example, the mixing unit temperature may reach 80° C. when 70 seconds or more have elapsed since the mixing valve control was started.

According to an example embodiment, feed-forward control and feedback control may be performed on the position of the mixing valve in real time based on the target mixing unit temperature. In the example in FIG. 7, feed-forward control in which the position of the mixing valve is configured to be 100% from 0 seconds to about 20 seconds may be performed. Configuring the position of the mixing valve to 100% may indicate that the mixing valve may supply only high-temperature heating media among low-temperature heating media and high-temperature heating media. That is, only high-temperature heating media stored in the second heating media supply unit 112 may be supplied to quickly raise the temperature of the heating media having a temperature of 40° C. previously. The position of the mixing valve may vary depending on the connection structure between the mixing valve and the flow path, and the position of the mixing valve may be determined to be 0% in order for the mixing valve to supply only the high-temperature heating media.

The time point, 20 seconds, may be a time point at which the mixing unit temperature has a temperature corresponding to 90% of the difference between the previous mixing unit temperature and the target mixing unit temperature. In the example in FIG. 7, the mixing unit temperature at 20 seconds may have a temperature of about 76° C. After 20 seconds, feedback control to gradually adjust the position of the mixing valve may be performed such that the mixing unit temperature may become the target mixing unit temperature of 80° C. For example, the position of the mixing valve may be adjusted gradually from 100% to 80%.

The position of the mixing valve MV may be adjusted in real time even after the mixing unit temperature sufficiently converges on the target mixing unit temperature. For example, the temperature of the heating media stored in the first heating media storage 111 and the second heating media storage 112 may change in real time. For example, as the heating media recovered from the load is distributed to the first heating media storage 111 and the second heating media storage 112, the heating media having different temperatures may flow into the first heating media storage 111 and the second heating media storage 112. The temperature of the heating media stored in the first heating media storage 111 and the second heating media storage 112 may change in real time due to the inflow of the heating media recovered from the load. The position of the mixing valve MV may be adjusted in real time according to the heating media temperature. In the example in FIG. 7, the mixing unit temperature according to an example embodiment may converge to 80° C. after about 60 seconds, and the position of the mixing valve MV may be adjusted by feedback control.

According to an example embodiment, the position of the mixing valve MV may be dynamically controlled based on the temperature of the recovery unit temperature sensor RTS, such that, despite the fluctuations in the heating media stored in the first heating media storage 111 and the second heating media storage 112, the temperature of the recovery unit temperature sensor RTS may be maintained to be constant.

In FIG. 7, the position of the distribution valve DV and bypass valves BV1 and BV2 over time is not provided. As described with reference to FIG. 5, the positions of the distribution valve DV and the bypass valves BV1 and BV2 may be synchronously controlled according to the position of the mixing valve MV. Accordingly, the flow rate and pressure of the flow path may be stably maintained even when the position of the mixing valve MV is dynamically controlled.

FIG. 8 is a diagram illustrating comparison of a recovery unit temperature over time between an example embodiment and a comparative example. FIG. 8 illustrates the example of changing the recovery unit temperature, which was 60° C. in the previous process recipe, to 80° C.-40° C.-80° C.-60° C. at intervals of 200 seconds. In the example in FIG. 8, the target temperature set may be 80° C.-40° C.-80° C.-60° C., and the target recovery unit temperature may be changed to 80° C.-40° C.-80° C.-60° C.

Referring to FIG. 8, in both the example of increasing or decreasing the temperature, the recovery unit temperature may be quickly changed in the example embodiment compared to in the comparative example. Also, in the comparative example, the recovery unit temperature may be oscillated, whereas the recovery unit temperature may be stably changed without oscillation in the example embodiment.

The temperature control system according to an example embodiment may quickly and accurately control the temperature of an electrostatic chuck ESC according to a target temperature set utilized in a process recipe. Accordingly, semiconductor processes may be performed quickly, and the quality of wafers produced in semiconductor facilities may be increased. Also, an automated temperature control based on the recovery unit temperature may be performed without performing manual tuning in each of the plurality of temperature control systems, such that the quality of wafers produced in a plurality of semiconductor facilities interlocked with each of a plurality of temperature control systems may be uniform.

Hereinafter, a temperature control system according to an example embodiment will be described with reference to FIGS. 9 to 15.

FIGS. 9 to 12 are diagrams illustrating a temperature control system according to an example embodiment.

Referring to FIGS. 1A to 8, in an example embodiment, the temperature control system 100 may use a recovery unit temperature sensor RTS as a reference temperature sensor, and may adjust the measured value of the recovery unit temperature sensor RTS based on an external target temperature set. However, example embodiments are not limited to an example of using the recovery unit temperature sensor RTS as a reference temperature sensor.

Figure 9:
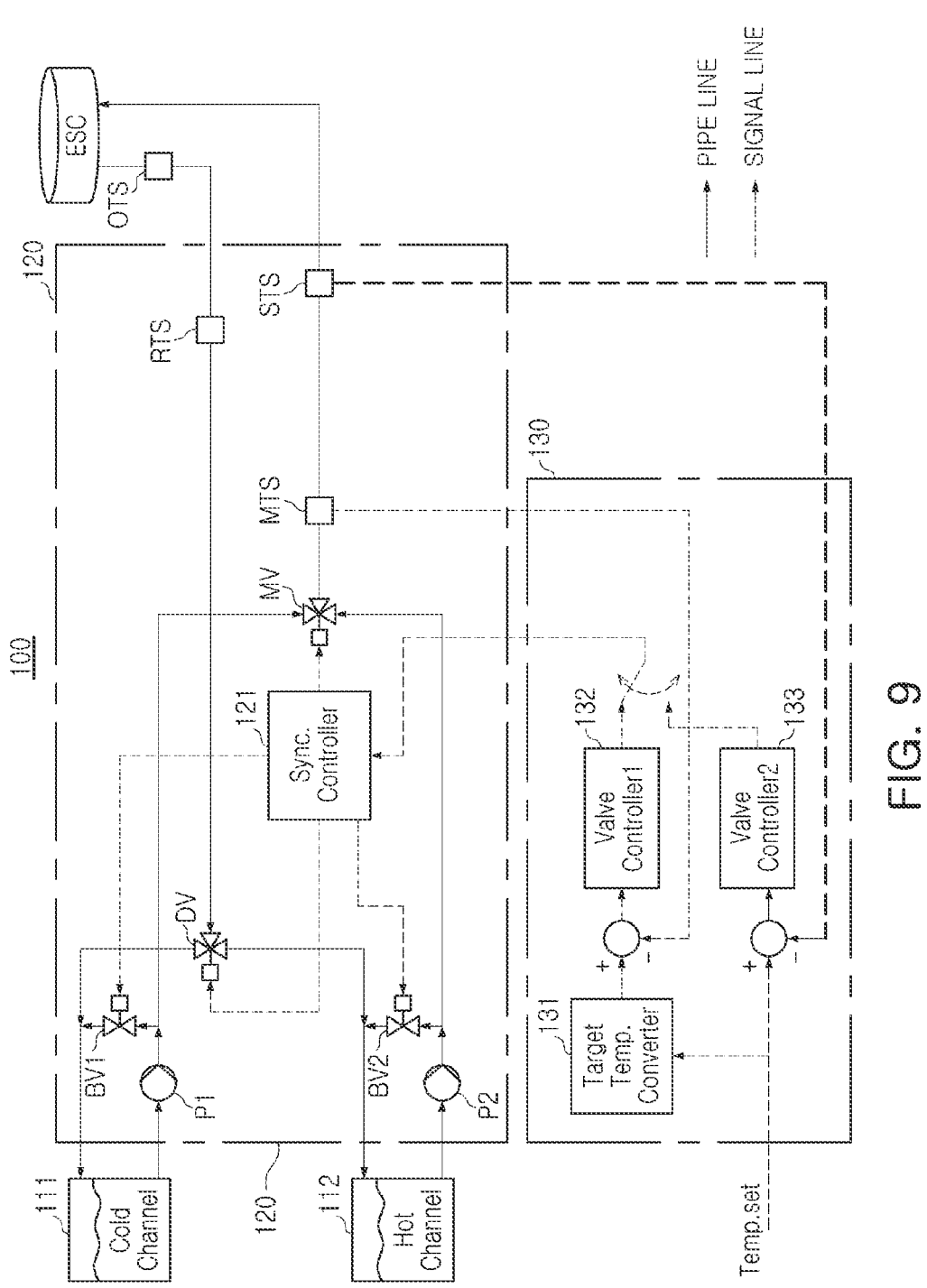
FIGS. 9 to 12 are diagrams illustrating a temperature control system according to an example embodiment of the present disclosure.

FIG. 9 illustrates a temperature control system 100 performing temperature control using a supply unit temperature sensor STS as a reference temperature sensor.

Differently from the temperature control system 100 in FIG. 1A in which the measured value of the recovery unit temperature sensor RTS is fed back to the second valve controller 133, in the temperature control system 100 in FIG. 9, the measurement value of the supply unit temperature sensor STS may be fed back to the second valve controller 133. Also, in the temperature control system 100 in FIG. 9, the positions of a plurality of valves MV, DV, BV1, and BV2 may be controlled based on a relationship model between the supply unit temperature and the mixing unit temperature.

Figure 10:
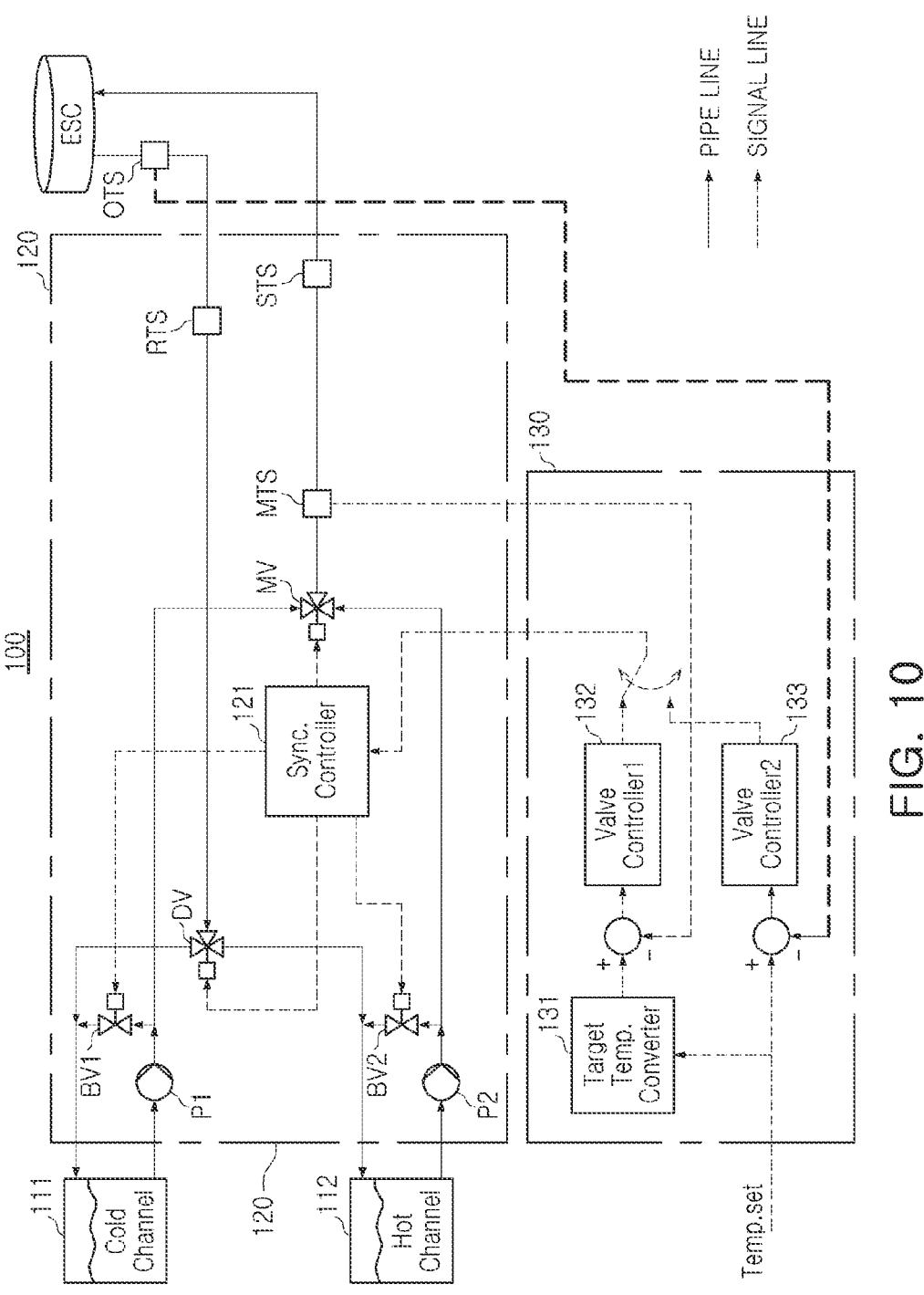

FIG. 10 illustrates a temperature control system 100 performing temperature control using an external temperature sensor OTS as a reference temperature sensor.

Differently from the temperature control system 100 in FIG. 1A, in the temperature control system 100 in FIG. 10, a measured value of an external temperature sensor OTS may be fed back to the second valve controller 133. Also, in the temperature control system 100 in FIG. 10, the position of a plurality of valves MV, DV, BV1, and BV2 may be controlled based on the relationship model between the external temperature around the electrostatic chuck ESC and the mixing unit temperature.

Since the external temperature sensor OTS is disposed outside the mixing device 120, a separate wire/wireless interface may be utilized for the control device 130 to obtain the temperature of the external temperature sensor OTS. However, when the temperature control system 100 uses an external temperature sensor OTS, temperature control may be performed using the temperature of the position most adjacent to the electrostatic chuck ESC as a reference temperature.

According to an example embodiment described with reference to FIGS. 1A to 10, the mixing valve MV and the distribution valve DV may be implemented as a three-way proportional control valve. However, example embodiments are not limited thereto.

Figure 11:
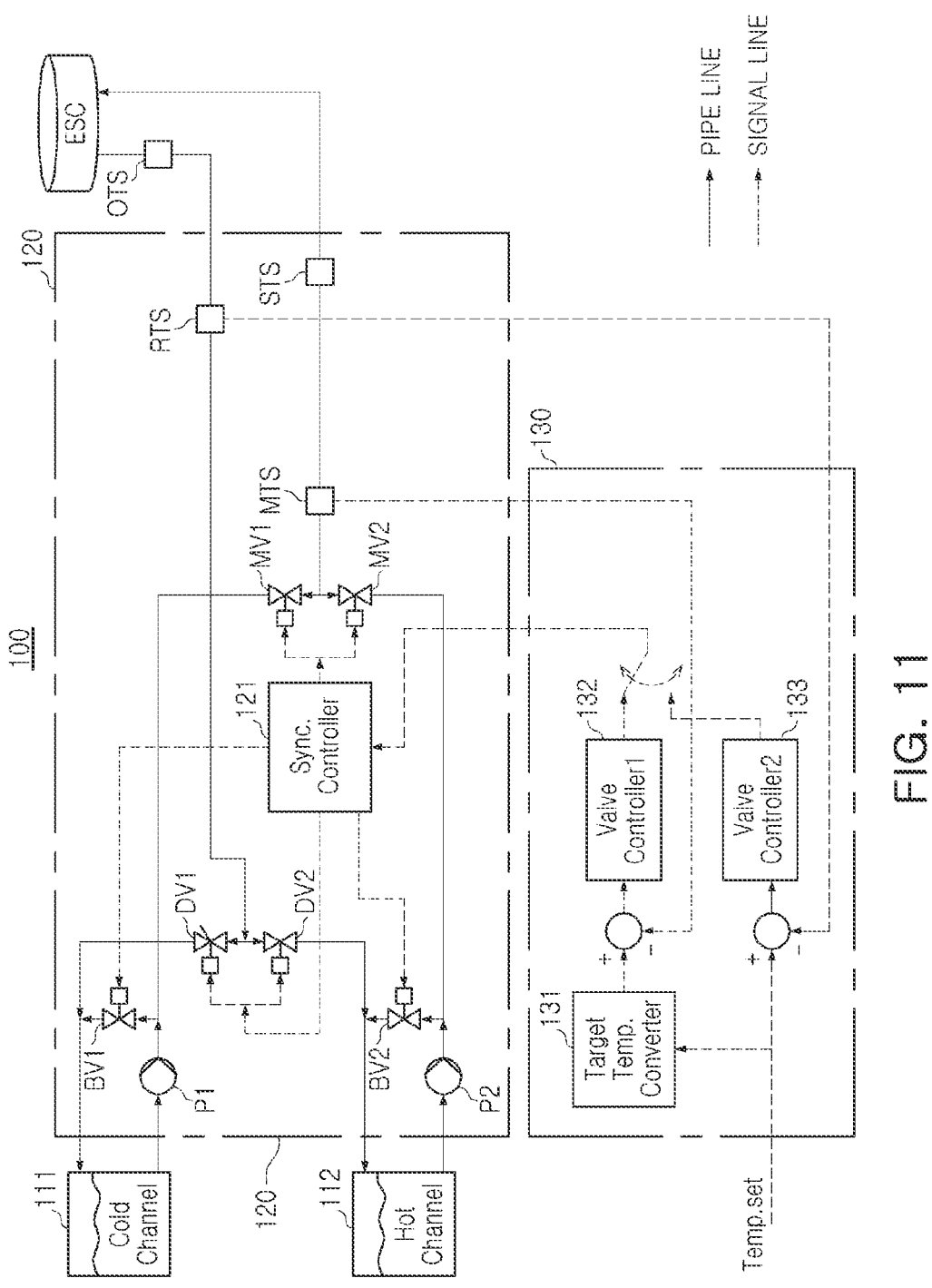

Referring to FIG. 11, each of the mixing valve and the distribution valve may be implemented as two two-way proportional control valves.

Differently from the temperature control system 100 in FIG. 1A, the temperature control system 100 in FIG. 11 may include a mixing valve implemented by two two-way proportional control valves MV1 and MV2 and a distribution valve implemented by two two-way proportional control valves DV1 and DV2.

To control the heating media ratio of the first heating media storage 111 and the second heating media storage 112 supplied to the electrostatic chuck ESC using a mixing valve, two-way proportional control valves MV1 and MV2 may be synchronously controlled. For example, to provide the heating media of the first heating media storage 111 and the heating media of the second heating media storage 112 at a ratio of 1:1, each of the two-way proportional control valves MV1 and MV2 may be controlled to have the same position.

To provide the heating media of the first heating media storage 111 and the heating media of the second heating media storage 112 in a 1:1 ratio, the flow rate and pressure of the heating media output by the mixing valve may be different when each of the two-way proportional control valves MV1 and MV2 is open 100% and when each of the two-way proportional control valves MV1 and MV2 is open 50%. Accordingly, when controlling the position of the two-way proportional control valves MV1 and MV2, the flow rate and pressure of the flow path may be further considered.

Figure 12:
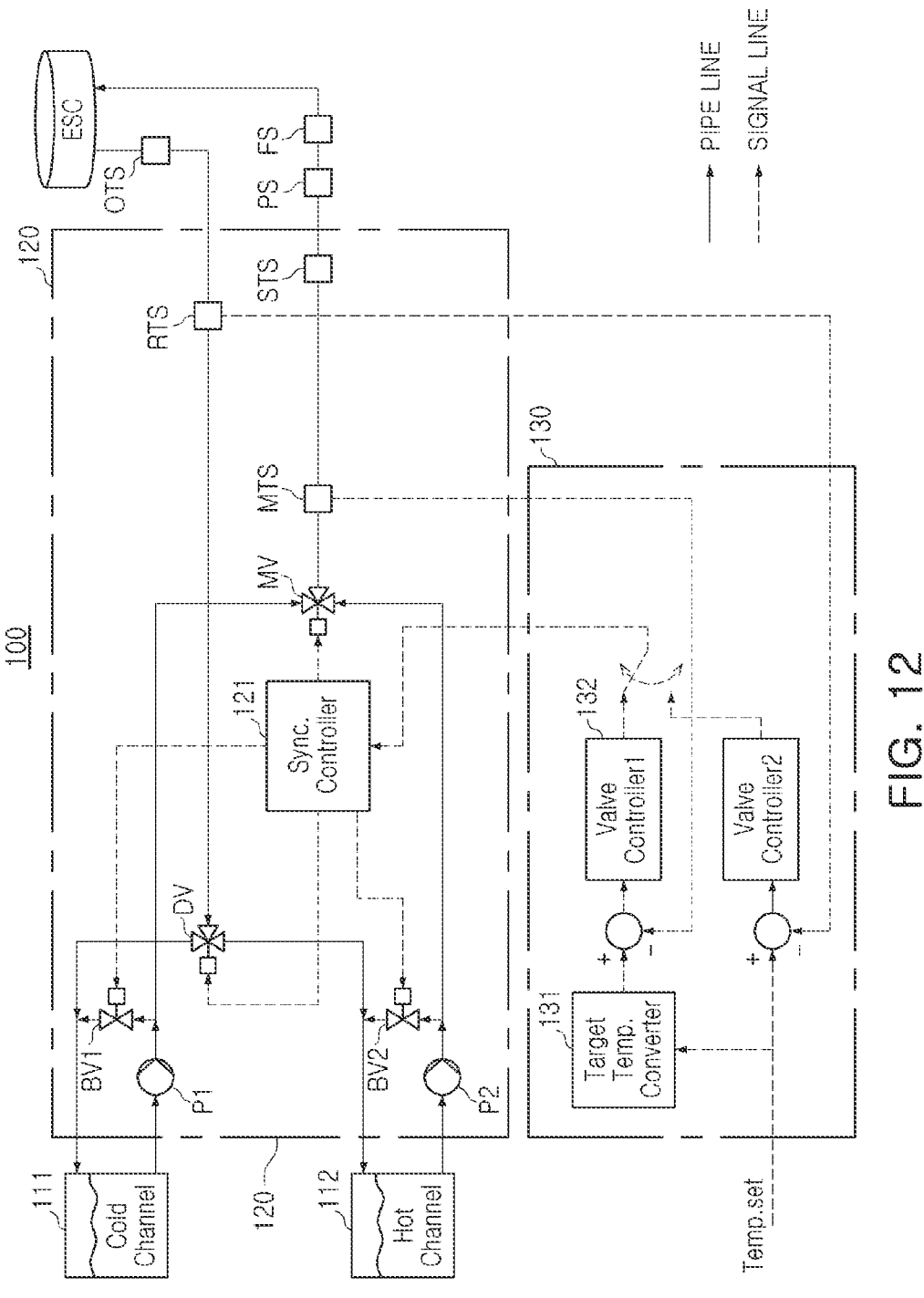

Referring to FIG. 12, the temperature control system 100 may further include a flow rate sensor FS and a pressure sensor PS that sense the flow rate and pressure of the flow path. In the example in FIG. 12, the flow rate sensor FS and the pressure sensor PS may be disposed on a path on which heating media is supplied to the electrostatic chuck ESC and may be disposed outside the mixing device 120. However, example embodiments are not limited thereto. For example, according to embodiments, the flow rate sensor FS and pressure sensor PS may be disposed in the mixing device 120, or may be disposed in the path on which the heating media is recovered from the electrostatic chuck ESC.

According to an example embodiment described with reference to FIGS. 1A to 12, the temperature control system 100 may perform feedback control based on the measured value of the reference temperature sensor. Accordingly, the temperature control system 100 may control the measured value of the reference temperature sensor to have the target reference temperature without using a separate temperature controller to adjust the temperature of the heating media output by the mixing valve MV to be the target reference temperature.

An example embodiment in which the temperature control system 100 may further include a temperature controller may be further included. According to example embodiments, the temperature control system 100 may perform temperature control more quickly using a separate temperature controller. Hereinafter, a temperature control system further including a temperature controller will be described in greater detail with reference to FIGS. 13 and 14.

Figure 13:
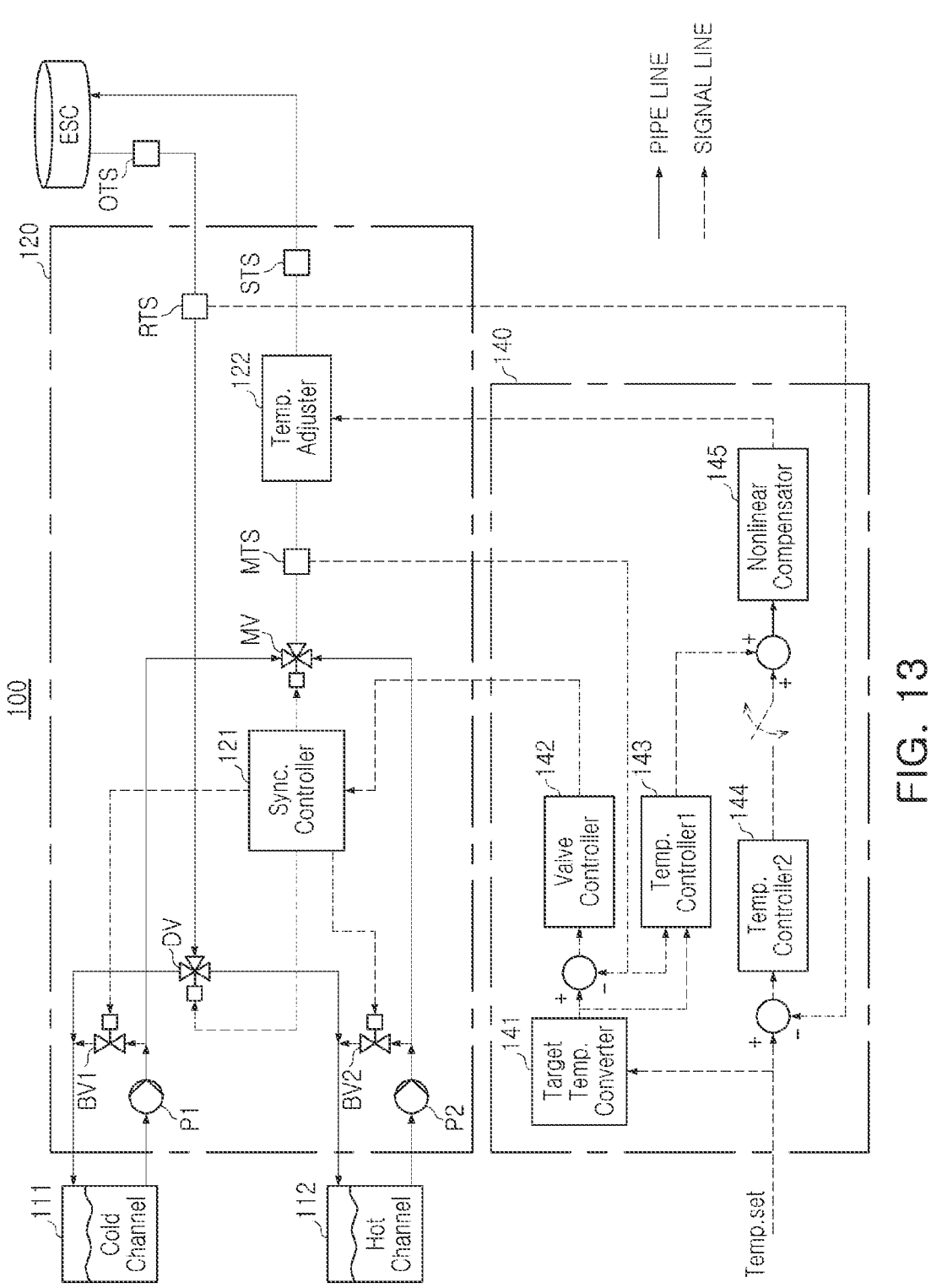
FIG. 13 is a diagram illustrating a temperature control system according to an example embodiment of the present disclosure.

FIG. 13 is a diagram illustrating a temperature control system according to an example embodiment.

Referring to FIG. 13, the temperature control system 100 may include a first heating media storage 111, a second heating media storage 112, a mixing device 120 and a control device 140. The first heating media storage 111 and the second heating media storage 112 may be the same as the example described with reference to FIG. 1A. The control device 140 may have a configuration different from that of the control device 130 described with reference to FIG. 1A.

The mixing device 120 may further include a temperature controller 122 (also referred to as a temperature adjuster), differently from the mixing device 120 described with reference to FIG. 1A. The temperature controller 122 may be disposed in a flow path on which the heating media of the mixing valve MV is output.

The temperature controller 122 may include a Peltier element. The temperature controller 122 may additionally heat or cool the heating media output by the mixing valve MV based on the difference between the measured value of the mixing unit temperature sensor MTS and the target mixing unit temperature of the mixing unit temperature sensor MTS. For example, when the target recovery unit temperature of the recovery unit temperature sensor RTS is 80° C., the target mixing unit temperature may be determined to be 82° C. based on a relationship model between the recovery unit temperature and the mixing unit temperature. When the temperature of the mixed heating media on the output end of the mixing valve MV is 68° C., the temperature controller 122 may additionally heat the heating media by 14° C. and may provide the media to the electrostatic chuck ESC. The heating media heated to 82° C. may be gradually cooled while moving to the electrostatic chuck ESC along the flow path, and may be supplied to the electrostatic chuck ESC as heating media of about 80° C. When the feedback control of the mixing valve MV is sufficiently performed and the temperature of the mixed heating media reaches 82° C., the temperature controller 122 may supply the heating media to the electrostatic chuck ESC without performing additional heating or cooling of the mixed heating media.

A relationship between an input voltage or an input current of the temperature controller 122 and the amount of change in temperature may have non-linearity. Due to non-linearity, it may be difficult to apply voltage or current to the temperature controller 122 according to the amount of change in temperature which the control device 140 may target.

Figures 14, 15:
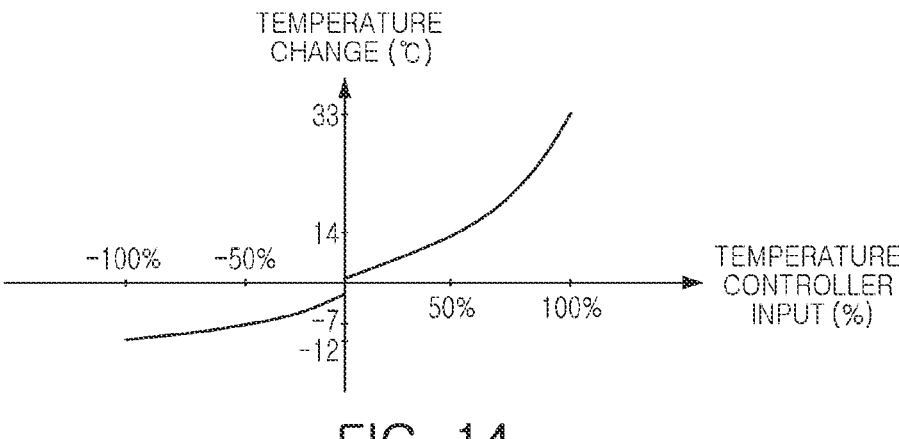
FIG. 14 is a diagram illustrating a nonlinearity between an output of a temperature controller and the amount of change in temperature.
FIG. 15 is a diagram illustrating a structure of a control device.

FIG. 14 is a diagram illustrating nonlinearity between an input of a temperature controller and the amount of change in temperature. In the example in FIG. 14, based on the supply of the maximum voltage to the temperature controller as 100%, the relative magnitude of the voltage applied to the temperature controller may be indicated.

Referring to FIG. 14, a relationship between an input of a temperature controller and the amount of change in temperature may have non-linearity. For example, when a positive voltage of 100% is applied to the temperature controller, the temperature of the heating media may increase by 33° C., and when a positive voltage of 50% is applied, the temperature of the heating media may increase by 14° C. Also, when a 100% negative voltage is applied to the temperature controller, the temperature of the heating media may be reduced by −12° C., and when a 50% negative voltage is applied, the temperature of the heating media may be reduced by −7° C.

According to example embodiment, the control device 140 may perform linear control by correcting non-linearity of the temperature controller.

Referring back to FIG. 13, the control device 140 may include a target temperature converter 141, a valve controller 142, a first temperature controller 143, a second temperature controller 144 and a nonlinear controller 145.

Similarly to the target temperature converter 131 described with reference to FIG. 1A, the target temperature converter 141 may convert the target recovery unit temperature received from an external entity to the target mixing unit temperature of the mixing unit temperature sensor MTS.

The valve controller 142 may perform feed-forward control and feedback control based on a mixing unit temperature sensor MTS similarly to the first valve controller 132 described with reference to FIG. 1A. For example, the valve controller 142 may determine the shaped target mixing unit temperature by performing reference shaping of the target mixing unit temperature, and may determine the mixing ratio according to feed-forward control and feedback control based on the shaped target mixing unit temperature, thereby controlling the positions of multiple valves MV, DV, BV1, and BV2.

The first and second temperature controllers 143 and 144 may determine an amount of temperature control to be controlled by the temperature controller 122. The first temperature controller 143 may determine an amount of temperature control according to a difference between the target mixing unit temperature obtained from the target temperature converter 141 and a measured value of the mixing unit temperature sensor MTS. Also, the second temperature controller 144 may determine the amount of temperature control according to a difference between the target recovery unit temperature received from an external entity and a measured value of the recovery unit temperature sensor RTS.

The first temperature controller 143 and the second temperature controller 144 may be selectively enabled. For example, the first temperature controller 143 may be enabled until the mixing unit temperature reaches a temperature within a predetermined range from the target mixing unit temperature, and the second temperature controller 144 may be enabled after the mixing unit temperature reaches a temperature within the predetermined range.

The nonlinear controller 145 may control the voltage applied to the temperature controller 122 based on the control temperature received from the first temperature controller 143 or the second temperature controller 144. The nonlinear controller 145 may control the voltage applied to the temperature controller 122 based on a relationship model between the amount of temperature control and the voltage output or current output of the temperature controller 122. For example, the nonlinear controller 145 may control the voltage applied to the temperature controller 122 based on a table indicating a voltage or current to be applied to the temperature controller 122 according to the control temperature.

The control device 130 or the control device 140 described with reference to FIGS. 1A to 14 may be implemented as a hardware device, and components included in the control device 130 or the control device 140 may be implemented as a software module.

FIG. 15 is a diagram illustrating a structure of a control device.

Referring to FIG. 15, the control device 1000 may include a processor 1100 connected to a system bus 1001, a working memory 1200, an input/output device 1300 and a secondary storage device 1400 (also referred to as auxiliary storage). Through the system bus 1001, the processor 1100, the working memory 1200, the input/output device 1300 and the auxiliary storage device 1400 may be electrically connected to each other and may exchange data with each other. The configuration of the system bus 1001 is not limited to the above example, and may further include mediation means for efficient management.

The control device 1000 may be provided as a dedicated device that controls the temperature of a semiconductor manufacturing device. For example, the control device 1000 may include a plurality of software modules for temperature control.

The processor 1100 may be implemented to execute at least one instruction. For example, the processor 1100 may be implemented to execute software (e.g., an application program, an operating system, and device drivers) to be executed in the control device 1000. The processor 1100 may execute an operating system loaded into the working memory 1200. The processor 1100 may execute various application programs to be driven based on an operating system. For example, the processor 1100 may be implemented as a central processing unit (CPU), a microprocessor, an application processor (AP), or another processing device similar thereto.

The working memory 1200 may be implemented to store at least one instruction. For example, an operating system or application programs may be loaded into the working memory 1200. When the control device 1000 boots, the OS image stored in the secondary storage device 1400 may be loaded into the working memory 1200 according to a booting sequence. Overall input/output operations of the control device 1000 may be supported by the operating system. Similarly, application programs may be loaded into the working memory 1200 to provide basic services.

For example, when the control device 1000 corresponds to the control device 140 described with reference to FIG. 13, software modules corresponding to a target temperature converter 1210, a valve controller 1220, a first temperature controller 1230, a second temperature controller 1240 and a nonlinear compensator 1250 may be loaded into the working memory 1200.

The working memory 1200 may be implemented as a volatile memory such as, for example, Dynamic Random Access Memory (DRAM) or Static Random Access Memory (SRAM), or a nonvolatile memory such as, for example, a flash memory, phase change random access memory (PRAM), resistance random access memory (RRAM), nano floating gate memory (NFGM), polymer random access memory (PoRAM), magnetic random access memory (MRAM), and ferroelectric random access memory (FRAM).

The input/output device 1300 may control user input and output by user interface devices. For example, the input/output device 1300 may receive information from a designer using an input means such as a keyboard, keypad, mouse, or touch screen. Using the input/output device 1300, the control device 1000 may receive the target reference temperature and the critical temperature. Also, the input/output device 1300 may include an output means such as a printer or a display and may display the process and results of the temperature control.

The secondary storage device 1400 may be provided as a storage medium of the control device 1000. The secondary storage device 1400 may store, for example, application programs, OS images, and various data. The secondary storage device 1400 may be provided in the form of a mass storage device such as, for example, a memory card (MMC, eMMC, SD, micro SD, or the like), a hard disk drive (HDD), a solid state drive (SSD), or universal flash storage (UFS).

The auxiliary storage device 1400 may store a relationship model between the reference temperature and the mixing unit temperature as illustrated in the graph in FIG. 2, and a relationship model between the temperature controller output and the amount of change in temperature as illustrated in the graph in FIG. 14. The relationship models may be stored in a table format. The relationship models may be previously stored in the auxiliary storage device 1400 and may be referred to by the processor 1100. Also, the relationship models may be updated when there is a change in semiconductor manufacturing facilities interlocked to the temperature control system 100.

According to the aforementioned example embodiments, the temperature control system may quickly control the reference temperature by performing feedback control based on the mixing unit temperature using a relationship model between the reference temperature and the mixing unit temperature.

Also, the temperature control system may allow the temperature of the electrostatic chuck to quickly reach the target temperature by performing reference shaping of the feed-forward input according to the target temperature.

Also, the temperature control system may synchronously control the degree of opening and closing of the valves included in the system, such that, even when the degree of opening and closing a valve of the mixing unit fluctuates in real time due to feedback control, the flow rate of the heating media transferred to the electrostatic chuck and the pressure of the flow path may be stably maintained.

As is traditional in the field of the present disclosure, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions.

While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A temperature control system of a semiconductor manufacturing device, the temperature control system comprising:

a first heating media storage configured to store low-temperature heating media;

a second heating media storage configured to store high-temperature heating media, wherein a temperature of the high-temperature heating media is greater than a temperature of the low-temperature heating media;

a mixing valve configured to mix the low-temperature heating media and the high-temperature heating media at a predetermined mixing ratio, and to supply the mixed heating media to a load;

a first bypass valve configured to recover the low-temperature heating media output by the first heating media storage to the first heating media storage;

a second bypass valve configured to recover the high-temperature heating media output by the second heating media storage to the second heating media storage;

a distribution valve configured to distribute a recovered heating media recovered from the load to the first heating media storage and the second heating media storage;

a synchronous controller configured to synchronously control the mixing valve, the first bypass valve, the second bypass valve, and the distribution valve based on the mixing ratio;

a flow path provided through which heating media flows through the first heating media storage, the second heating media storage, the mixing valve, the first bypass valve, the second bypass valve, the load, and the distribution valve;

a mixing temperature sensor disposed at an output end of the mixing valve in the flow path;

a reference temperature sensor disposed more adjacent to the load than the mixing temperature sensor in the flow path; and a control device configured to obtain a target reference temperature for a reference temperature measured by the reference temperature sensor from an external entity, to change the target reference temperature to a target mixing temperature of a mixing temperature based on a relationship model between the reference temperature and the mixing temperature measured by the mixing temperature sensor, and to control a position of the mixing valve based on the target mixing temperature and the mixing temperature.

2. The temperature control system of claim 1, wherein the control device performs reference shaping for the target mixing temperature, and performs feed-forward control and feedback control over the position of the mixing valve based on a result of performing the reference shaping.

3. The temperature control system of claim 2, wherein, when a new target reference temperature is higher than a previous target reference temperature, the control device determines a shaped target mixing temperature having a value higher than the target mixing temperature by performing reference shaping for the target mixing temperature.

4. The temperature control system of claim 1, wherein, when a new target reference temperature is higher than a previous target reference temperature, the control device performs feed-forward control and feedback control over the position of the mixing valve based on a shaped target mixing temperature and the mixing temperature until the reference temperature reaches a critical temperature, and wherein the critical temperature is higher than the previous target reference temperature and lower than the new target reference temperature.

5. The temperature control system of claim 4, wherein the critical temperature is determined such that a difference between the critical temperature and the previous target reference temperature has a predetermined ratio to a difference between the new target reference temperature and the previous target reference temperature.

6. The temperature control system of claim 5, wherein the control device performs feedback control over the position of the mixing valve based on the reference temperature and the target reference temperature after the reference temperature reaches the critical temperature.

7. The temperature control system of claim 1, wherein, when a new target reference temperature is lower than a previous target reference temperature, the control device performs feed-forward control and feedback control over the position of the mixing valve based on a shaped target mixing temperature and the mixing temperature until the reference temperature reaches a critical temperature, and wherein the critical temperature is lower than the previous target reference temperature and higher than the new target reference temperature.

8. The temperature control system of claim 1, wherein the synchronous controller is an electronic cam configured to control a position of the first bypass valve, a position of the second bypass valve, and a position of the distribution valve in conjunction with the position of the mixing valve.

9. The temperature control system of claim 1, wherein the synchronous controller controls each of a position of the first bypass valve, a position of the second bypass valve and a position of the distribution valve based on the position of the mixing valve.

10. The temperature control system of claim 1, wherein the temperature control system further comprises a mixing device comprising the mixing valve, the first bypass valve, the second bypass valve, the distribution valve and the synchronous controller, and wherein the reference temperature sensor is configured as at least one of a supply temperature sensor disposed where the mixed heating media is output by the mixing device in the flow path, an external temperature sensor disposed where the recovered heating media is output by the load in the flow path, and a recovery temperature sensor disposed where the recovered heating media is supplied to the mixing device from an external entity in the flow path.

11. The temperature control system of claim 1, further comprising:

a temperature controller disposed on the output end of the mixing valve and configured to control a temperature of the mixed heating media based on a difference between the mixing temperature and the target mixing temperature.

12. The temperature control system of claim 11, wherein the control device applies a voltage or a current determined according to a difference between the mixing temperature and the target mixing temperature to the temperature controller based on a relationship model of an amount of temperature control according to a voltage input or a current input of the temperature controller.

13. The temperature control system of claim 11, wherein the temperature controller includes a Peltier element.

14. The temperature control system of claim 1, wherein each of the mixing valve and the distribution valve is a three-way proportional control valve, and wherein each of the first bypass valve and the second bypass valve is a two-way proportional control valve.

15. The temperature control system of claim 1, wherein the mixing valve comprises two two-way proportional control valves, wherein the distribution valve comprises two two-way proportional control valves, and wherein each of the first bypass valve and the second bypass valve is a two-way proportional control valve.

16. The temperature control system of claim 1, wherein the load is an electrostatic chuck on which a wafer is mounted in the semiconductor manufacturing device.

17. A temperature control system of a semiconductor manufacturing device, the temperature control system comprising:

a first heating media storage configured to store low-temperature heating media;

a second heating media storage configured to store high-temperature heating media, wherein a temperature of the high-temperature heating media is greater than a temperature of the low-temperature heating media;

a mixing device comprising a mixing valve configured to mix the low-temperature heating media and the high-temperature heating media at a predetermined mixing ratio, wherein the mixing device is configured to provide mixed heating media to a load, and to distribute recovered heating media recovered from the load to the first heating media storage and the second heating media storage; and a control device configured to, by performing feed-forward control and feedback control over a mixing temperature using a relationship model between a reference temperature representing a temperature of heating media passing through the load and the mixing temperature which is a temperature of heating media output by the mixing valve, control the mixing ratio such that the reference temperature has a target reference temperature.

18. The temperature control system of claim 17, wherein the control device comprises:

a target temperature converter configured to convert the target reference temperature received from an external entity into a target mixing temperature of the mixing temperature;

a first valve controller configured to perform feed-forward control over the mixing ratio based on the target mixing temperature, and to perform feedback control to adjust the mixing ratio based on the mixing temperature and the target mixing temperature until the reference temperature reaches a critical temperature; and a second valve controller configured to perform feedback control to adjust the mixing ratio based on the reference temperature and the target reference temperature after the mixing temperature reaches the critical temperature.

19. The temperature control system of claim 17, further comprising a temperature controller configured to control a temperature of the mixed heating media output by the mixing valve, wherein the control device comprises:

a target temperature converter configured to convert the target reference temperature received from an external entity into a target mixing temperature of the mixing temperature;

a valve controller configured to perform feed-forward control over the mixing ratio based on the target mixing temperature and to perform feedback control to adjust the mixing ratio based on the mixing temperature according to a result of controlling the mixing ratio;

a first temperature controller configured to output a first difference between the mixing temperature and the target mixing temperature;

a second temperature controller configured to output a second difference between the reference temperature and the target reference temperature;

a nonlinear compensator configured to control an input of the temperature controller based only on the first difference received from the first temperature controller until the reference temperature reaches a temperature within a predetermined range from the target reference temperature, to control the input of the temperature controller based on the first difference and the second difference received from the second temperature controller after the reference temperature reaches a temperature within the predetermined range, and to control the input of the temperature controller based on a nonlinear relationship between the input of the temperature controller and an amount of change in temperature.

20. A temperature control system of a semiconductor manufacturing device, the temperature control system comprising:

a mixing valve supplying mixed heating media obtained by mixing low-temperature heating media and high-temperature heating media at a predetermined mixing ratio to a load, wherein a temperature of the high-temperature heating media is greater than a temperature of the low-temperature heating media; and a control device determining a target reference temperature of a reference temperature sensor configured to measure a temperature of a heating medium in a flow path adjacent to the load, converting the target reference temperature into a target mixing temperature for a mixing temperature sensor adjacent to a mixing valve configured to mix the low-temperature heating media and the high-temperature heating media, performing reference shaping on the target mixing temperature and adjusting the mixing ratio based on a result of the reference shaping and a mixing temperature, and adjusting the mixing ratio based on the reference temperature measured by the reference temperature sensor and the target reference temperature when the reference temperature reaches a temperature within a predetermined range from the target reference temperature.

* * * * *